(12) United States Patent
Kanada et al.

(10) Patent No.: US 8,525,208 B2
(45) Date of Patent: Sep. 3, 2013

(54) LIGHT EMITTING DEVICE

(75) Inventors: Morito Kanada, Anan (JP); Hideo Asakawa, Anan (JP)

(73) Assignee: Nichia Corporation, Anan-shi (JP)

( * ) Notice: Subject to any disclaimer, the term of this patent is extended or adjusted under 35 U.S.C. 154(b) by 365 days.

(21) Appl. No.: 13/056,580

(22) PCT Filed: Jul. 8, 2009

(86) PCT No.: PCT/JP2009/003192
§ 371 (c)(1),
(2), (4) Date: Jan. 28, 2011

(87) PCT Pub. No.: WO2010/013396
PCT Pub. Date: Feb. 4, 2010

(65) Prior Publication Data
US 2011/0175127 A1    Jul. 21, 2011

(30) Foreign Application Priority Data

Jul. 29, 2008   (JP) ................................ 2008-194918
Jul. 29, 2008   (JP) ................................ 2008-195484

(51) Int. Cl.
*H01L 33/10*   (2010.01)
*H01L 33/48*   (2010.01)
*H01L 33/62*   (2010.01)

(52) U.S. Cl.
USPC ......... 257/98; 257/99; 257/676; 257/E23.047

(58) Field of Classification Search
USPC .................. 257/98, 99, 676, E23.047
See application file for complete search history.

(56) References Cited

U.S. PATENT DOCUMENTS

| 6,984,539 B2 * | 1/2006 | Yoon ................................ 438/29 |
| 2002/0149314 A1 | 10/2002 | Takahashi et al. |
| 2004/0046242 A1 | 3/2004 | Asakawa |
| 2005/0277216 A1 | 12/2005 | Asakawa |
| 2007/0284708 A1 | 12/2007 | Hanya |
| 2008/0048201 A1 | 2/2008 | Kim et al. |
| 2008/0296592 A1 * | 12/2008 | Osamu ........................... 257/89 |

FOREIGN PATENT DOCUMENTS

| JP | 2002-314146 A | 10/2002 |
| JP | 2004-363537 A | 12/2004 |
| JP | 2006-222382 A | 8/2006 |
| JP | 2006-253551 A | 9/2006 |
| JP | 2007-311549 A | 11/2007 |
| JP | 2007-317974 A | 12/2007 |
| JP | 2008-053726 A | 3/2008 |
| JP | 2008-166332 A | 7/2008 |

* cited by examiner

*Primary Examiner* — Evan Pert
(74) *Attorney, Agent, or Firm* — Global IP Counselors, LLP

(57) ABSTRACT

A light emitting device has a package having an opening provided with a side surface and a bottom surface, and a lead frame exposed to the bottom surface. The lead frame includes a reflection portion bent on the side surface, and a portion of an inner wall surface of the reflection portion is positioned in an inner portion of the package. A light emitting device has a package having a recessed portion on a front surface, a lead frame exposed to a bottom surface of the recessed portion, a light emitting element disposed on the lead frame, and a sealing resin filled into the recessed portion. The lead frame includes a bent portion bent towards the front surface of the package in the recessed portion, and a projecting portion bent to project from the package towards an outer portion, and disposed on a face opposed to the front surface.

20 Claims, 14 Drawing Sheets (a)

(b)

(c)

LIGHT EMITTING DEVICE

CROSS-REFERENCE TO RELATED APPLICATIONS

This U.S. national phase application claims priority to Japanese Patent Application Nos. 2008-194918 and 2008-195484, both filed on Jul. 29, 2008, the entire disclosures of which are hereby incorporated herein by reference.

TECHNICAL FIELD

The present invention relates to a light emitting device using a light emitting element, and in particular relates to a thin light emitting device used as a back light or the like in a liquid-crystal display.

BACKGROUND ART

In recent years, high-luminance, high-output light emitting elements or small light emitting devices have been developed for use in various technical fields. These types of light emitting devices are characterized by small size, low power consumption, low weight, or the like, and for example, find application as a light source of mobile telephones and the light source of liquid-crystal back lights, the light source of various types of meters, and various types of reading sensor, or the like.

For example, a light source used in a back light is configured by arranging light emitting elements in an opening of a package, and filling translucent resin that includes phosphors to thereby cover the light emitting element.

The resin used in the package of such conventional light sources (light emitting devices) has low light resistance properties. As a result, the light efficiency is reduced as a result of discoloration of the side surface of the opening caused by light that is emitted from the light emitting element towards the side surface of the opening. In this manner, the problem arises that product durability is reduced.

Furthermore, since the resin used in the package exhibits low heat resistance, the conventional light emitting device encounters problems such as deformation and discoloration of the package due to heat produced by the light emitting element.

In this context, as shown for example in FIG. 4, discoloration caused by light from the light emitting element is prevented, and heat produced by the light emitting element is radiated by bending a part of a lead frame 400 to thereby cover the portion of the package that undergoes conspicuous discoloration with a blade portion 401, 403 (for example, Japanese Unexamined Patent Laid-Open Application No. 2008-53726).

SUMMARY OF THE INVENTION

However although the configuration shown in FIG. 4 provides a solution to the above problem, merely covering the upper end face 406 of the blade portion 401, 403 with the package 405 leads to a risk of peeling at the interface between the blade portion and the package as a result of the difference in the coefficient of thermal expansion between the blade 401, 403 that is made of metal and the package 405.

Furthermore heat radiated from the light-emitted elements is transmitted to the lead frame along the inner wall of the package because of the good thermal conductivity of the lead frame. The recessed portion of the package is normally sealed with resin to protect the light emitting elements, or to arrange wavelength conversion members. Such sealing resins come into contact with the lead frame, and therefore are adversely affected by the heat that is radiated by the lead frame or heat that is transmitted to the lead frame. In other words, although the method that is disclosed in Japanese Unexamined Patent Laid-Open Application No. 2008-53726 is effective in relation to prevention of discoloration of the inner wall of the package, since the contact surface area of the sealing resin and the lead frame is large, the problem arises that the use life is shortened due to a progression of discoloration of the sealing resin due to heat transmitted in the lead frame. Furthermore since the adhesion between the lead frame and the sealing resin is lower than that between the package and the sealing resin, there is the problem that peeling tends to occur at the interface between the lead frame and the sealing resin.

In this regard, it is the object of the present invention to provide a light emitting device that strengthens the adhesion between the lead frame and the package, that prevents interfacial peeling between the lead frame and the package, that prevents discoloration of the package due to light from the light emitting element, and that enables efficient radiation of heat produced by the light emitting element.

A light emitting device according to a first aspect of the present invention includes a package that has an opening provided with a side surface and a bottom surface, and a lead frame that is exposed to the bottom surface. The lead frame includes a bent reflection portion on the side surface, and a portion of the inner wall surface of the reflection portion is positioned in an inner portion of the package.

A light emitting device formed with the above configuration enables light from the light emitting element to be reflected by the reflection portion that has high reflectance, and prevents discoloration of the package. Furthermore the adhesion between the reflection portion and the package is strengthened by disposing a portion of the inner wall surface of the reflection portion in an inner portion of the package. Therefore, peeling at the interface between the reflection portion and the package can be prevented.

In the present invention, towards an upper surface of the opening from the portion covering a section of the inner wall surface, the side surface of the opening includes a face that preferably has an angle of inclination relative to the bottom surface that is smaller than the angle of inclination relative to the bottom surface of the reflection portion.

This configuration prevents the light from the light emitting element from coming into direct contact with the opening upper side, and thereby prevents discoloration of the package.

In the present invention, it is preferred that a sealing member that includes phosphors is provided in the opening, and that the phosphors are disposed at least more on the bottom surface side than the portion covering a section of the inner wall surface.

This type of configuration enables radiation of heat produced by the phosphors to the outside through the lead frame that is exposed to the bottom surface of the opening and the reflection portion.

A light emitting device according to a second aspect of the present invention includes a package that has a recessed portion on a front surface, a lead frame that is exposed to the bottom surface of the recessed portion, a light emitting element that is disposed on the lead frame, and a sealing resin that is filled into the recessed portion. The lead frame includes a bent portion that is bent towards the front surface of the package in the recessed portion, and a projecting portion that is bent to project from the package towards the outside, and is disposed on a face opposed to the front surface of the package.

This light emitting device preferably has a notch portion on the surface opposed to the front surface of the package, and the projecting portion is accommodated in the notch portion.

Furthermore, the lead frame preferably sandwiches the bent portion, and has at least a pair of supporting portions that are embedded in the package.

According to the present invention, a light emitting device can be provided in which the adhesion between the reflection portion which is bent a part of the lead frame, and the package can be strengthened, and peeling at the interface of the reflection portion and the package can be prevented, furthermore, discoloration of the package caused by light from the light emitting element can be prevented, and heat produced by the light emitting element and the phosphors can be efficiently radiated.

DETAILED DESCRIPTION OF THE PREFERRED EMBODIMENTS

The embodiments of the present invention will be described below making reference to the figures. However the embodiments below are merely exemplary, and no limitation on the light emitting device is thereby implied by the following light emitting devices. Furthermore in the following description, those members which are the same or equivalent are denoted by the same name and reference number and detailed description thereof will be omitted as suitable.

First Embodiment

Figure 1A:
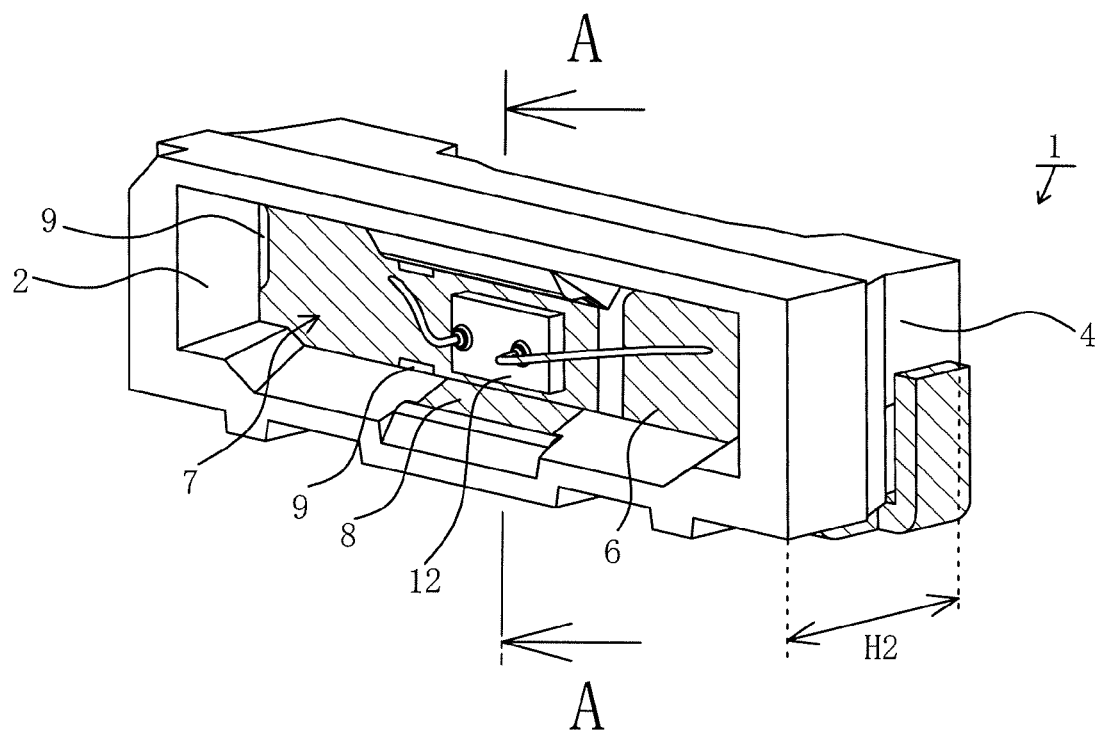
FIG. 1A is a perspective view of a light emitting device according to the present invention.
Figure 1B:
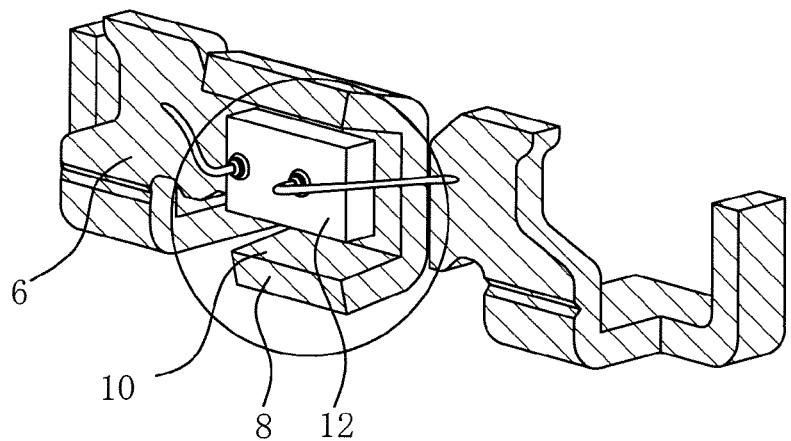
FIG. 1B is a perspective view of a lead frame in the light emitting device according to the present invention.
Figure 1C:
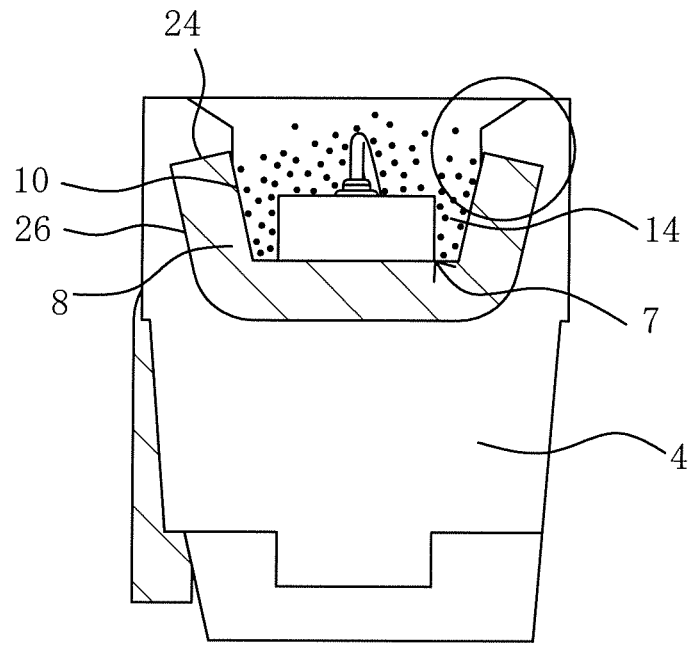
FIG. 1C is a sectional view along A-A in FIG. 1A.
Figure 1D:
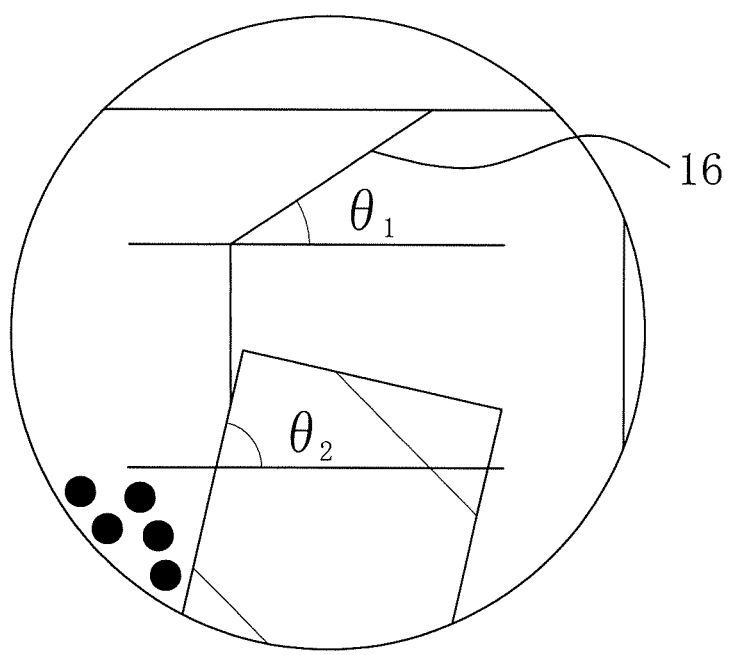
FIG. 1D is a partially enlarged view of FIG. 1C.
Figure 1E:
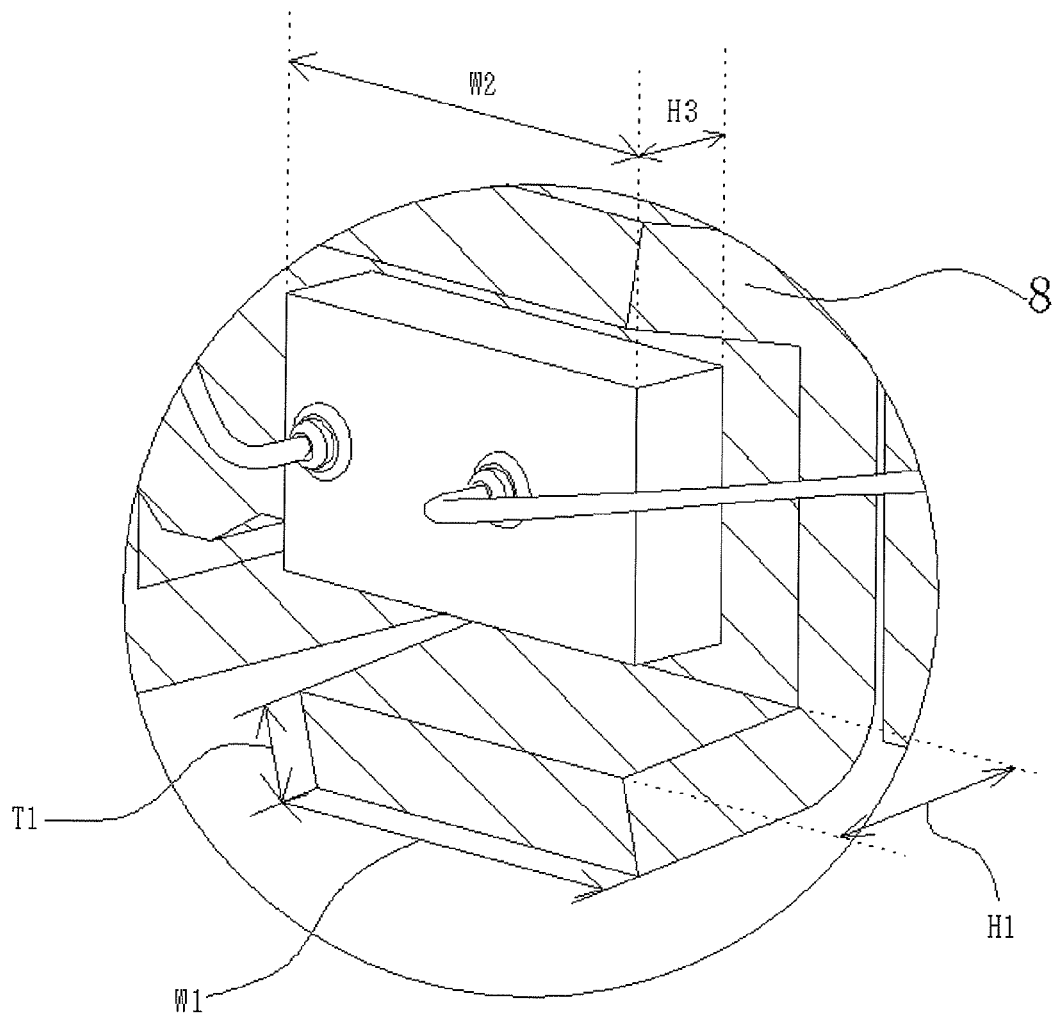
FIG. 1E is a partially enlarged view of FIG. 1B.
Figure 2A:
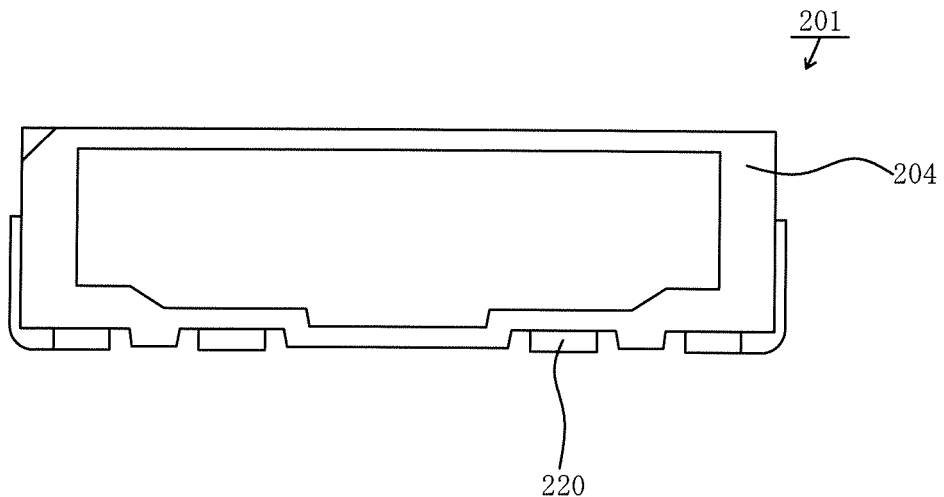
FIG. 2A is a front view showing another light emitting device according to the present invention.
Figure 2B:
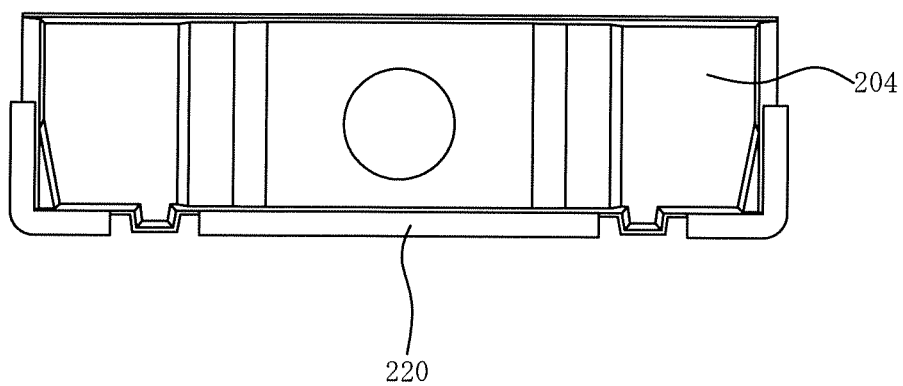
FIG. 2B is a back view of FIG. 2A.
Figure 2C:
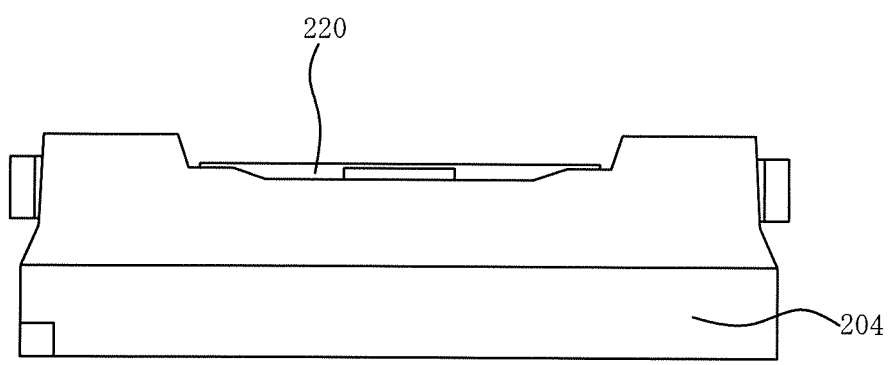
FIG. 2C is a plan view of FIG. 2A.
Figure 2D:
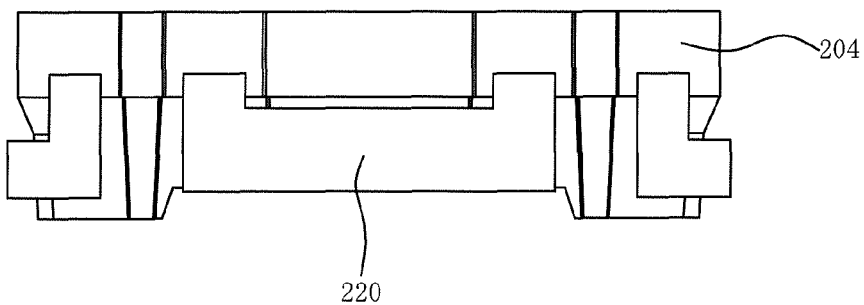
FIG. 2D is a bottom view of FIG. 2A.
Figure 2E:
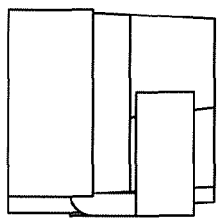
FIG. 2E is a right side view of FIG. 2A.
Figure 2F:
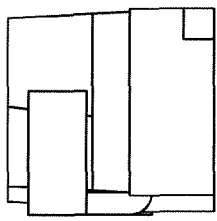
FIG. 2F is a left side view of FIG. 2A.
Figure 2G:
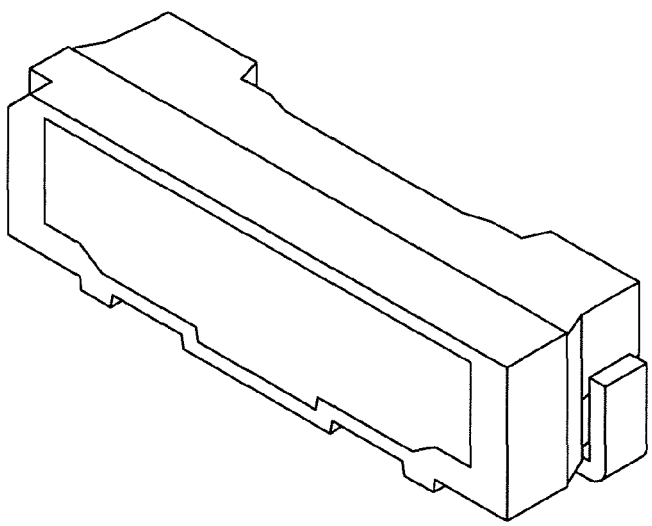
FIG. 2G is a perspective view seen from an upper inclination of FIG. 2A.
Figure 2H:
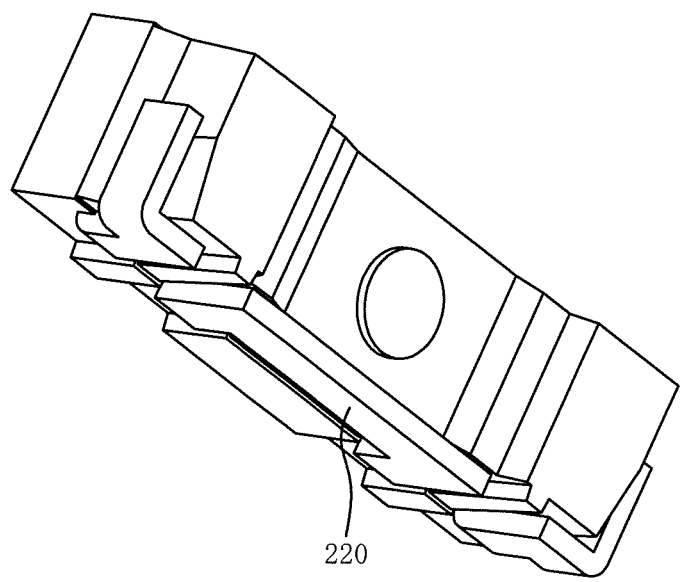
FIG. 2H is a perspective view seen from a rear inclination of FIG. 2A.
Figure 2I:
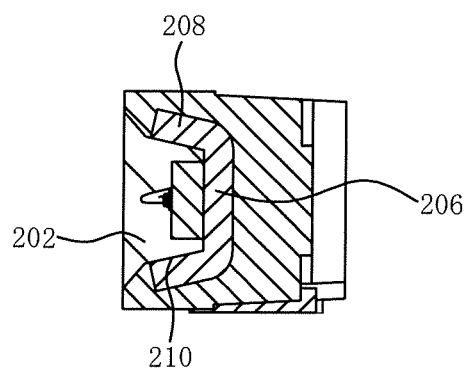
FIG. 2I is a sectional view along A-A in FIG. 2A.
Figure 2J:
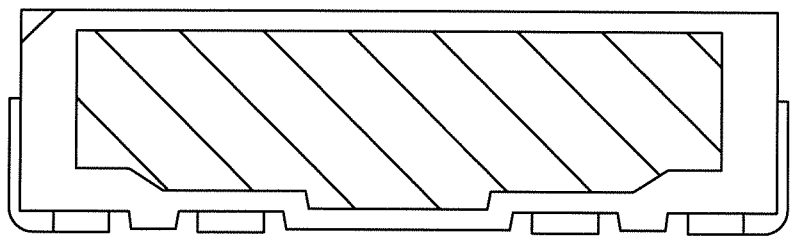
FIG. 2J is a front diagonal view of the sealing member in FIG. 2A.
Figure 2K:
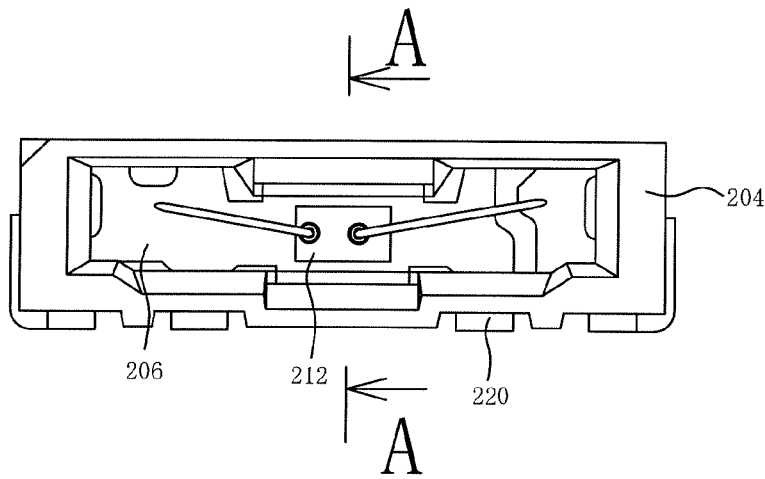
FIG. 2K is a front view showing the state when the sealing member is not filled.

FIG. 1A is a perspective view of a light emitting device according to the present invention. FIG. 1B is a perspective view of a lead frame in the light emitting device according to the present invention. FIG. 1C is a sectional view along A-A in FIG. 1A. FIG. 1D is a partial enlarged view of FIG. 1C. FIG. 1E is a partial enlarged view of FIG. 1B. FIG. 2A is a front view showing another light emitting device according to the present invention. FIG. 2B is a back view of FIG. 2A. FIG. 2C is a plan view of FIG. 2A. FIG. 2D is a bottom view of FIG. 2A. FIG. 2E is a right side view of FIG. 2A. FIG. 2F is a left side view of FIG. 2A. FIG. 2G is a perspective view seen from an upper inclination of FIG. 2A. FIG. 2H is a perspective view seen from a rear inclination of FIG. 2A. FIG. 2I is a sectional view along A-A in FIG. 2A. FIG. 2J is a front diagonal view of the sealing member in FIG. 2A. FIG. 2K is a front view showing the state when the sealing member is not filled. FIG. 3A-FIG. 3F are a schematic sectional views showing the method of manufacturing the light emitting device according to the present invention.

The light emitting device 1 according to the present invention as shown in FIG. 1 includes a package 4 that has an opening 2 provided with a side surface and a bottom surface, and a lead frame 6 that is exposed at the bottom surface 7 of the opening 2. The lead frame 2 in the present invention includes a reflection portion 8 bent on a side surface of the opening, and a portion of the inner wall surface 10 of the reflection portion 8 is positioned on an inner portion of the package 4.

In the reflection portion 8, the inner wall surface 10 denotes a face that mainly reflects light that is emitted from the light emitting element, and refers to the face on the exposed side on the side surface of the opening.

Opening 2

An opening 2 is formed in the package 3. An exposed lead frame 6 is provided on the bottom surface 7 of the opening 2.

In the present invention, the opening has a rectangular shape, and on the side surfaces of the opening proximate to the light emitting element, the portions covering the inner wall surface of the reflection portions are formed with a higher thickness than other portions, and the side surfaces not proximate to the light emitting element of the opening are formed with substantially the same thickness. However, there is no particular limitation in this regard, and as long as a part of the surface of the lead frame 6 that is electrically connected with the bottom surface of the opening is exposed, the opening shape may be oval, triangular, square, or a shape approximating any of these shapes.

The depth of the opening 2 can be suitably adjusted with reference to the number of the mounted light emitting elements 12, and the bonding method. A large sized opening 2 is preferred to obtain a wider light distribution. The bottom surface and/or the side surface of the opening 2 is preferably subjected to embossing or plasma processing to thereby increase the contact surface area and improve the adhesion with the sealing resin.

In the present embodiment, as shown in FIG. 1, a reflection portion 8 bent is provided on the side surface of the opening, and a portion of the inner wall surface 10 of the reflection portion 8 is positioned in an inner portion of the package 4. In this manner, light from the light emitting element is reflected by the high-reflectance inner wall surface 10 of the reflection portion 8, and thereby enables efficient extraction of light. In conjunction with this effect, the side surface of the opening is formed by the reflection portion 8 formed from a metallic material, and therefore discoloration of the package 4 by light emitted from the light emitting element 12 can be prevented. Furthermore, adhesion between the package and the reflection portion can be strengthened by disposing a portion of the inner wall surface 10 of the reflection portion 8 in an inner portion of the package 4, and thereby it is possible to prevent peeling at the interface of the package and the reflection portion.

The inner wall surface 10 is preferably covered by the package at least 10% of the total area of the overall inner wall surface from the upper end of the inner wall surface and to above the height of the light emitting element. It is still more preferred that a portion of the overall inner wall surface is covered by the package.

In this manner, adhesion between the reflection portion and the package can be improved, and it is possible to prevent peeling at the interface between the reflection portion and the package.

When the whole inner wall surface 10 is covered by the package, the side surface of the opening will be covered by a package molding material exhibiting low light resistance, and therefore deterioration caused by light from the light emitting element cannot be prevented.

As shown in FIG. 1, it is preferred that the whole surface of the upper surface 24 that is adjacent to the inner wall surface 10 of the reflection portion 8, and the outer wall surface 26 that is adjacent to the upper surface 24 and faces the inner wall surface 10 is respectively covered by the package.

In this manner, adhesion of the package and the reflection portion can be strengthened, and thereby it is possible to prevent peeling at the interface of the package and the reflection portion.

As shown in FIG. 1D, towards an upper surface of the opening from the portion covering the section of the inner wall surface 10 (hereinafter referred to as the "engaging portion"), the side surface of the opening 2 preferably has a face 16 (hereinafter referred to as "inclination face") that has an inclination angle $\theta_1$ relative to the bottom surface of the opening 2 that is smaller than the inclination angle $\theta_2$ of the reflection portion 8 relative to the bottom surface of the opening 2. In this manner, light from the light emitting element can be prevented from coming into direct contact with the upper side of the opening, and thereby prevents discoloration of the package.

It is preferred that the inclination angle $\theta_1$ of the inclination face 16 relative to the bottom surface of the opening is between 30 degrees to 90 degrees. It is preferred that the inclination angle $\theta_2$ of the reflection portion 8 relative to the bottom of the opening is between 60 degrees to 90 degrees. In this manner, direct incidence of light from the light emitting element can be prevented, and support of the inner wall surface 10 is enabled.

The inclination face may include one face or a plurality of faces.

Package 4

The package 4 according to the present invention as shown in FIG. 1 includes the opening 2, and includes the lead frame 6 on a bottom surface of the opening 2. Furthermore, the package 4 works as a supporting body that fixes and retains the lead frame 6 that mounts the light emitting element 12, and has a function which protects the light emitting element 12 from the external environment.

There is no particular limitation on the molding material of the package used in the present invention, and any conventionally used thermoplastic resin such as a liquid crystal polymer, a polyphthalamide resin, polybutylene terephthalate (PBT), or the like may be used. In particular, when using a semicrystalline polymer that includes a high-melting point crystal such as a polyphthalamide resin, a superior package is obtained that has a high surface energy, and exhibits superior adhesion with a light guide plate or the like that is capable of fitting thereafter, or a sealing member that can be provided in an inner opening portion. In this manner, the generation of peeling can be suppressed at the interface between the package and the sealing member during a cooling process in a step of filling and curing the sealing member. Furthermore, a white pigment such as tungsten oxide may be mixed into the package molding member in order to efficiently reflect light from the light emitting element.

The front surface of the package 4 may not be a single plane, but may have a stepped portion. In the present invention, as shown in FIG. 1A, the front surface of the package 4 has a stepped portion.

Reflection Portion 8

The reflection portion 8 is a portion of the lead frame, and is formed by bending on a side surface of the opening. The reflection portion 8 includes the inner wall surface 10, the upper surface 24 that is adjacent to the inner wall surface, and the outer wall surface 26 that is adjacent to the upper surface 24 and faces the inner wall surface 10. The whole surface of the outer wall surface 26 and the upper surface 24 of the reflection portion 8 is covered by the package, and a portion of the inner wall surface 10 is positioned in an inner portion of the package 4.

In the present invention, the reflection portion 8 sandwiches the light emitting element, and is formed on both side surfaces in a position most proximate to the light emitting element, that exhibits a tendency to undergo discoloration due to light from the light emitting element.

In this manner, deterioration of the package can be prevented since the portion that tends to suffer deterioration due to light from the light emitting element is covered on both side surfaces of the package by the reflection portion.

Although at least one reflection portion 8 is formed, it is preferred that two are provided. When two are provided, symmetrical formation is preferred with respect to angle, width, height in relation to the light emitting element 12. Symmetrical formation of the reflection portion 8 with respect to the light emitting element enables a symmetrical light distribution.

The reflection portion 8 may be formed symmetrically with respect to the light emitting element/or two or more may be formed asymmetrically.

Furthermore, it is preferred that a groove or an indentation is provided on an outer wall surface 26 of the reflection portion 8, and a high surface area of contact between the package and the reflection portion 8 is provided. In this manner, improved adhesion between the package and the reflection portion is enabled, and thereby the problem of peeling at the interface between the package and the reflection portion can be solved.

It is preferred that a notch or a groove is provided on the upper surface 24 side of the inner wall surface 10, and that the notch or groove is covered by the package. In this manner, the surface area of contact between the package 4 and the reflection portion 8 can be increased, the adhesion between the package and the reflection portion can be increased, and thereby the problem of peeling at the interface between the package and the reflection portion can be solved.

As shown in FIG. 1, the width W1 of the reflection portion 8 is preferably 100% or more of the width W2 of the light emitting element. In this manner, discoloration of the package can be prevented since the positions of the package which tend to be discolored as a result of light from the light emitting portion can be covered by the reflection portion.

The height H1 of the reflection portion is preferably substantially 50 to 90% of the height H2 of the package, and from another point of view, 100% or more of the height H3 of the light emitting element. In this manner, discoloration of the package can be prevented since the positions of the package which tend to be discolored as a result of light from the light emitting portion can be covered by the reflection portion.

The thickness T1 of the reflection portion is preferably substantially the same as the thickness of portions of the package other than reflection portion of the lead frame, and more preferably thinner than the portions of the package other than reflection portion of the lead frame. When the thickness T1 of the reflection portion is thinner than the thickness of other portions of the lead frame, both curving and shaping are facilitated when forming the reflection portion by bending a portion of the lead frame.

As shown in FIG. 1D, the inclination angle $\theta_2$ of the inner wall surface relative to the bottom of the opening is preferably 60 degrees to 90 degrees. In this manner, discoloration of the package can be prevented by reflecting light from the light emitting element with the inner wall surface while enabling desired light distribution characteristics.

Lead Frame 6

The lead frame 6 is electrodes enabling electrical connection with the light emitting element. The lead frame 6 of the present invention as described above includes a bent reflection portion 8 on the side surface of the opening 2.

The lead frame may be substantially plate-shaped, or may be a plate shape that includes an undulating shape.

The film thickness may be uniform, or may exhibit localized thickness or thinness. There is no particular limitation on the material, and use is preferred of a material having a relatively large heat transfer coefficient. Formation using this type of material enables efficient release of heat produced by the light emitting element. For example, a preferred material has a heat transfer coefficient of at least 200 W/(m·K), that has a relatively large mechanical strength, or that can easily be processed by a punching pressing process, or etching process. More specifically, the material includes a metal such as copper, aluminum, gold, silver, tungsten, iron, nickel or the like, an iron-nickel alloy, a phosphor bronze alloy, or the like. Furthermore, it is preferred that reflective plating is executed to enable efficient extraction of light from the mounted light emitting element on the surface of the lead frame.

As shown by FIG. 1A, it is preferred that a notch 9 is provided on the lead frame 6 of the bottom surface of the opening 2, and the package is exposed on the bottom surface of the opening. In this manner, the adhesion between the package and the sealing member that is filled into the opening as described below can be improved. Superior adhesion characteristics between the package and the sealing member prevent invasion of sulfidizing gas from the outside of the light emitting device, and enable an effect of preventing discoloration of the lead frame caused by sulfidizing gas. In addition, entry of water from the outside can be prevented.

Although provision of one notch 9 is preferred, as shown in FIG. 1A, a plurality thereof is still more preferred. Consequently the adhesion between the package that is exposed on the bottom surface of the opening and the sealing member can be improved by provision of a plurality of the notches 9.

As shown in FIG. 2, a heat radiating terminal 220 is preferably provided on the lead frame.

Heat produced by the light emitting element 212 and the phosphors (not shown) can be more efficiently radiated by provision of the heat radiating terminal.

When mounted, the heat radiating terminal is preferably formed on a face on the mounting side.

Light Emitting Element 12

The light emitting element 12 mounted in the opening 2 may be formed from any semiconductor material as long as the element may be termed a light emitting diode. For example, it may be formed as a laminated structure that includes an active layer using various types of semiconductors including a nitride semiconductor such as InN, AlN, GaN, InGaN, AlGaN, InGaAlN, a group III-V semiconductor, a group II-IV semiconductor, or the like.

In the present invention, a single light emitting element 12, or a plurality thereof may be mounted. The luminous intensity may be improved by combining a plurality of light emitting elements that produce light of the same emission color. For example, color reproduction may be improved by combining a plurality of light emitting elements having different emission colors adapted to an RGB for example.

These light emitting elements 12 as shown in FIG. 1 are mounted by a bonding member (not shown) on the lead frame 6 of the package 4 on the bottom surface of the opening 2. When using a light emitting element formed by depositing a nitride semiconductor on an insulating layer (sapphire substrate), this type of bonding member for example may be an epoxy resin, silicone, or the like. When the deterioration caused by heat or light from the light emitting element is taken into account, an Al plating may formed on the back surface of the light emitting element, and a solder such as an Au—Sn eutectic crystal, a brazing filler material such as a low-melting point metal, or the like, or a conductive paste, or the like may be used as a bonding material. Furthermore, when the light emitting element is formed from a conductive substrate (GaAs, or the like) and has an electrode formed on both faces such as a light emitting element that emits red light, mounting may be performed using a conductive paste such as silver, gold, palladium, or the like.

In addition to the light emitting element, a protective element may be mounted on the light emitting device of the present invention. The protective element may be mounted in the opening in which the light emitting element is disposed, or may be mounted by forming a separate opening on the package. It may be mounted on a back surface of the lead frame that mounts the light emitting element, and integrally formed with the package by covering with the package forming material. A single protective element may be provided, or a plurality of two or more may be provided. There is no particular limitation on the protective element, and any known component may be mounted on the light emitting device. More specifically, a Zener diode, a transistor diode, or the like may be used.

The light emitting device is normally connected by respective conductive wires to the positive pole and negative pole that are formed on the substrate.

The conductive wire requires superior ohmic characteristics, mechanical connection characteristics, electrical conductivity, heat transfer characteristics with the electrode of the light emitting element. The heat conductivity is preferably at least 0.01 cal/(s)(cm$^2$)(° C./cm), and more preferably 0.5 cal/(s)(cm$^2$)(° C./cm). In view of operational characteristics, the diameter of the conductive wire is preferably at least Φ10 μm and Φ45 μm or less. The diameter of the conductive wire is preferably at least 25 μm, and still more preferably is no more than 35 μm in order to ensure the light-emission surface area of the light emitting element, and handling characteristics. More specifically, this type of conductive wire may be a conductive wire formed from a metal such as gold, copper, platinum, aluminum, or the like, or an alloy thereof.

In addition to wire bonding, the light emitting element may employ flip chip bonding by using a conductive attachment member such as solder.

Sealing Member 14

The sealing member protects the light emitting element 12 from the external environment. The light emitting element 12 or the like is covered by the sealing member by curing a sealing-member material that has been filled into the opening 2 of the package in order to cover the light emitting element 12.

In the present invention, as shown in FIG. 1C, a sealing member 14 that includes phosphors is formed in the opening. The phosphors are preferably at least provided more towards the bottom surface 7 of the opening than the section that covers a portion of the inner wall surface 10.

In this manner, heat produced by the phosphors is transferred to the reflection portion 8, and passes through the lead frame 6 to be radiated to the outside.

The sealing member for example may be formed from a material having excellent weathering performance such as a silicone resin, an epoxy resin, a urea resin, a fluorocarbon resin, or a hybrid resin containing at least one of these resins. The sealing member is not limited to an organic substance, and an inorganic having excellent weathering performance such as glass, silica gel, or the like may be used. In the present invention, any material adapted for an application such as a viscosity improving agent, a light diffusion agent, a pigment, or the like may be added to the sealing member. The light diffusion agent includes barium titanate, titanium oxide, aluminum oxide, silicon dioxide, calcium carbonate, and mixtures containing one or more of the above compounds. Furthermore, a lens effect can be obtained by forming the light emission face of the sealing member into a suitable shape. More specifically, a convex lens shape, a concave lens shape, an oval shape when seen from the light emission measurement face or a shape being a combination thereof may be used.

Phosphors

The present invention may include phosphors that can convert the wavelength of light from the light emitting element. An example of this type of phosphor is a phosphor that contains a rare earth element as described below.

More specifically, a garnet-based phosphor may be used that contains at least one element selected from the group consisting of Y, Lu, Sc, La, Gd, Tb and Sm, and at least one element selected from the group consisting of Al, Ga and In. In particular, an aluminum/garnet phosphor includes at least one element selected from the group including Al and Y, Lu, Sc, La, Gd, Tb, Eu, Ga, In, and Sm, is activated by at least one element selected from the rare earth metals, and emits light due to excitation by visible light or ultraviolet light emitted from the light emitting element. In addition to an yttrium/aluminum oxide-based phosphor (YAG phosphor), the phosphor may be $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, $Y_{2.90}Ce_{0.05}Pr_{0.05}Al_5O_{12}$, or the like. In particular in the present invention, of the above compounds, two or more different composition types of an yttrium/aluminum oxide-based phosphor are used that contain Y, and that are activated by Pr or Ce.

A nitrous phosphor is a phosphor that contains N, and contains at least one element selected from Be, Mg, Ca, Sr, Ba, and Zn and at least one element selected from C, Si, Ge, Sn, Ti, Zr, and Hf, and is activated by at least one element selected from the rare earth elements. The nitrous phosphor includes for example $(Sr_{0.97}Eu_{0.03})_2Si_5N_8$, $(Ca_{0.985}Eu_{0.015})_2Si_5N_8$, $(Sr_{0.679}Ca_{0.291}Eu_{0.03})_2Si_5N_8$, or the like.

The method of manufacturing the light emitting device 1 according to the present invention will be described below making reference to FIG. 3A to FIG. 3F.

Figure 3A:
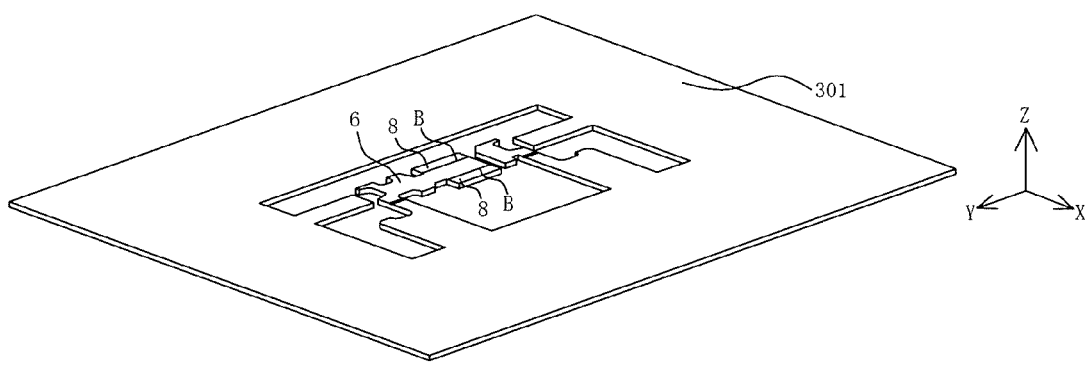
FIG. 3A is a schematic sectional view showing the method of manufacturing the light emitting device according to the present invention.
Figure 3B:
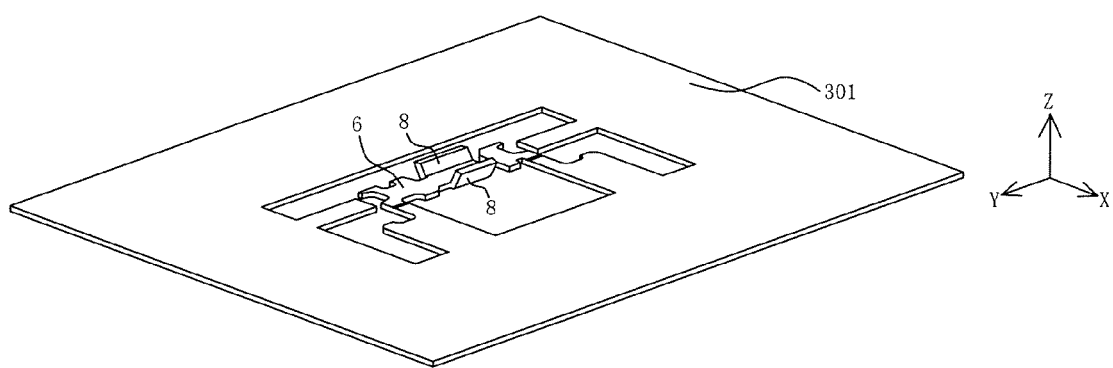
FIG. 3B is a schematic sectional view showing the method of manufacturing the light emitting device according to the present invention.
Figure 3C:
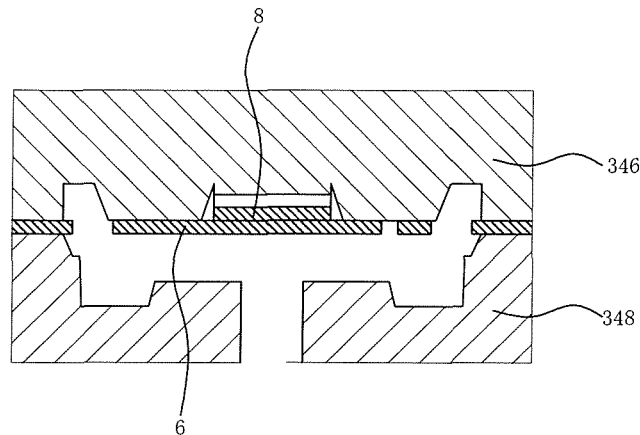
FIG. 3C is a schematic sectional view showing the method of manufacturing the light emitting device according to the present invention.
Figure 3D:
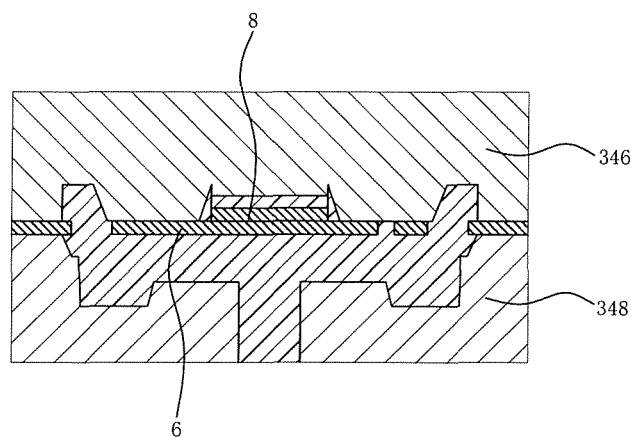
FIG. 3D is a schematic sectional view showing the method of manufacturing the light emitting device according to the present invention.
Figure 3E:
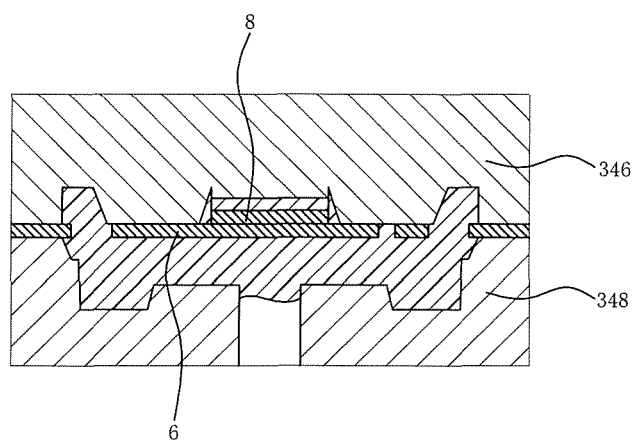
FIG. 3E is a schematic sectional view showing the method of manufacturing the light emitting device according to the present invention.
Figure 3F:
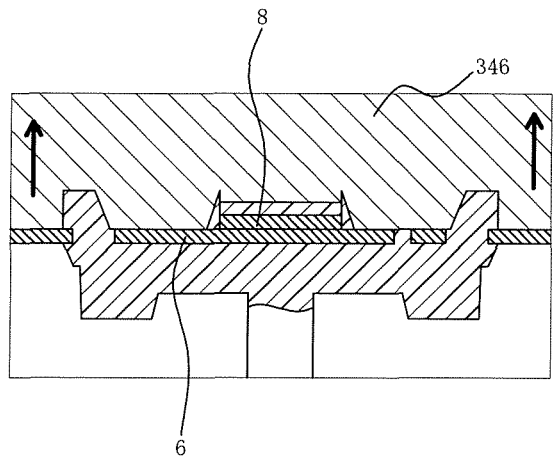
FIG. 3F is a schematic sectional view showing the method of manufacturing the light emitting device according to the present invention.
Figure 4:
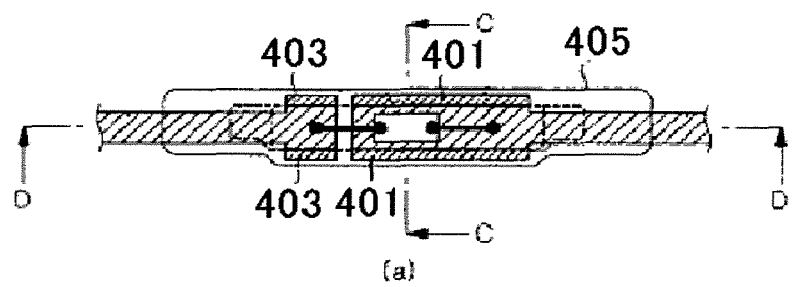
FIGS. 4(a) to 4(c) shows a conventional light emitting device.
Figure 4:
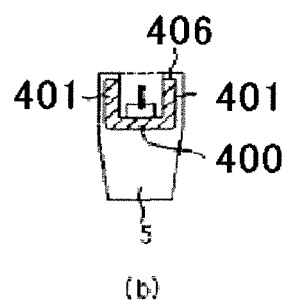
Figure 4:
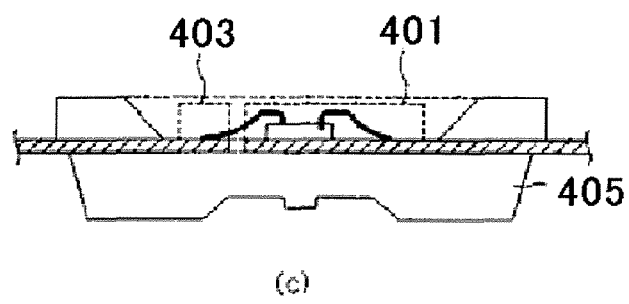

Firstly, a punching process is applied to a metal plate, and then metal plating is applied to the surface thereof to form, as shown in FIG. 3A, a lead frame plate 201 that will be formed into a lead frame. Next, a portion to form the reflection portion is bent in the Z direction at the position on the solid line B to obtain the lead frame plate 201 as shown in FIG. 3B. Then, as shown in FIG. 3C, a lead frame 6 and a reflection portion 8 that is a part of the lead frame is disposed in a sandwiched configuration between a molding dies 346, 348 that are divided into upper and lower dies for molding of the package. The upper die forms a recessed portion (not shown) that is adapted to thereafter cover a portion of the inner wall surface 10 of the reflection portion 8. Then, as shown in FIG. 3D, a molding material is injected into the cavity in the dies 346, 348 from a material injection gate in the lower die 348. Thereafter as shown in FIG. 3E, the molding material in the dies 346, 348 is cured, and as shown in FIG. 3F, firstly the lower die 238 is removed, and then the upper die 346 is removed in the direction of the arrow.

Second Embodiment

Figure 5:
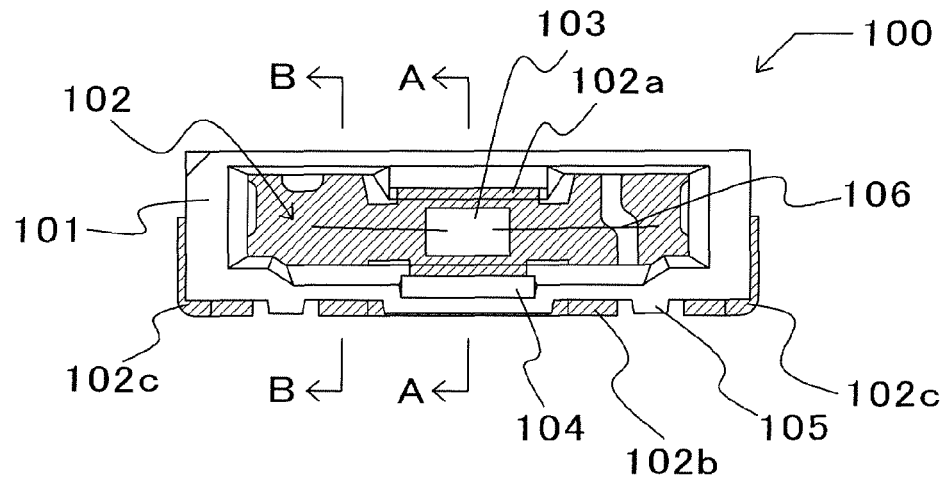
FIG. 5 is a front view of the light emitting device according to a second embodiment of the present invention.
Figure 6:
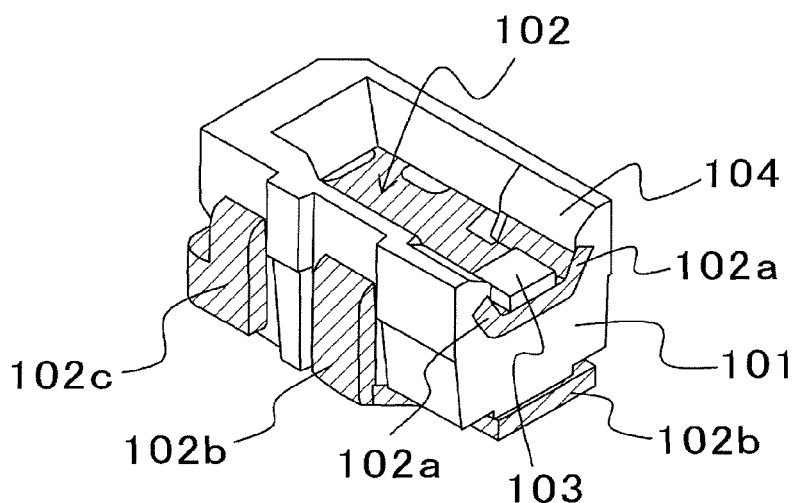
FIG. 6 is a sectional perspective view when the light emitting device shown in FIG. 5 is cut along the line A-A.
Figure 7:
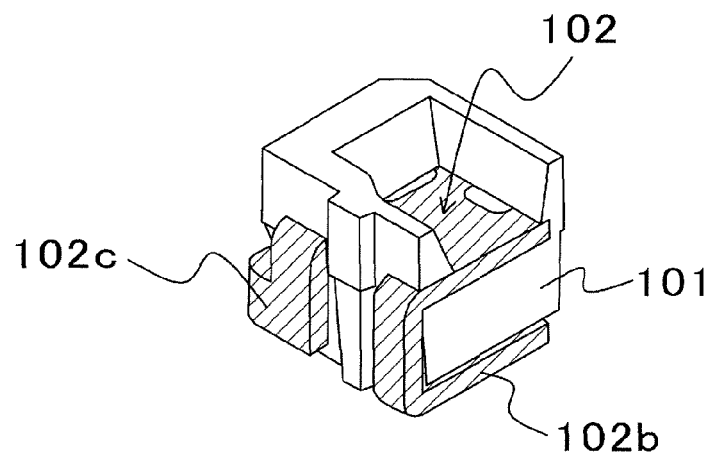
FIG. 7 is a sectional perspective view when the light emitting device shown in FIG. 5 is cut along the line B-B.
Figure 8:
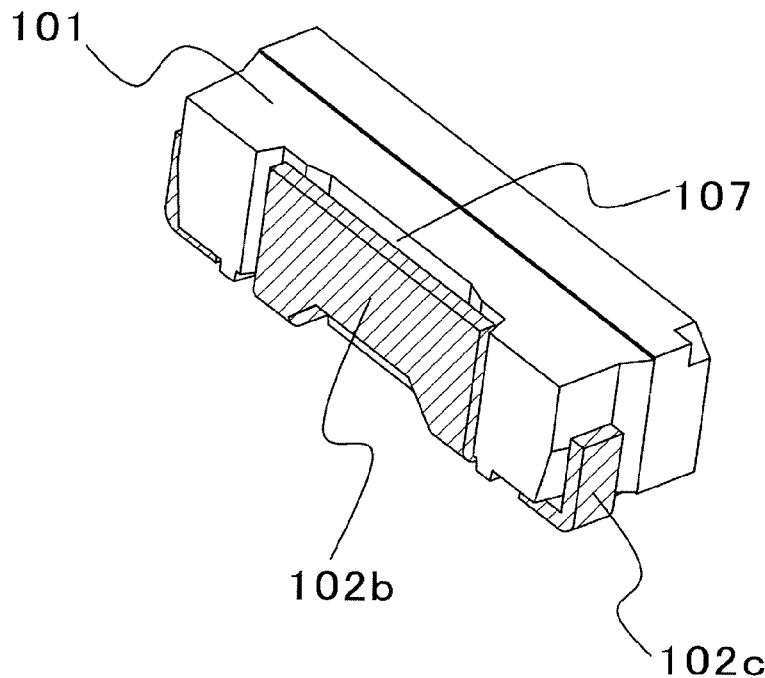
FIG. 8 is a perspective view showing an upper inclination of the back side of the light emitting device according to the present invention.
Figure 9:
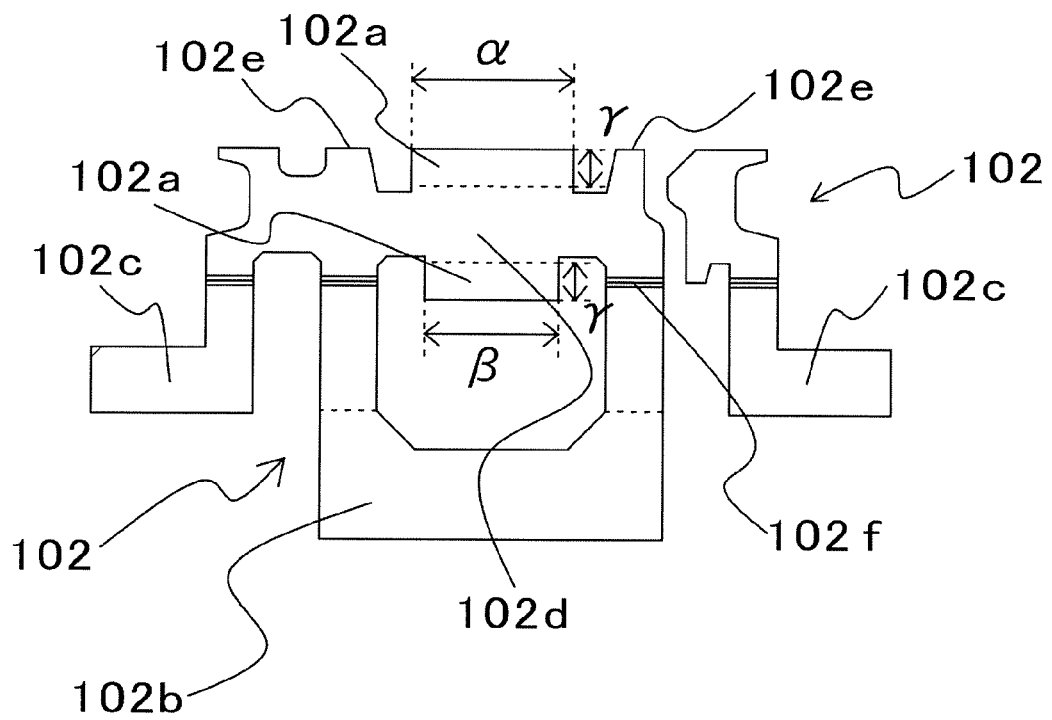
FIG. 9 shows a lead frame used in the light emitting body according to the present invention.
Figure 10:
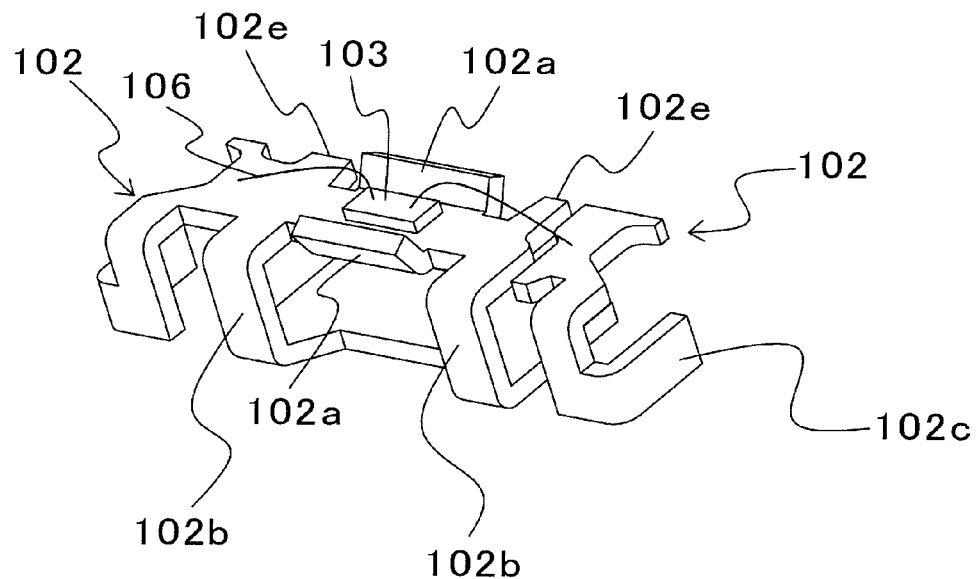
FIG. 10 shows a lead frame used in the light emitting body according to the present invention.

FIG. 5 to FIG. 10 show the external appearance of a light emitting device 100 according to a second embodiment of the present invention, and show sectional views of a lead frame 102 that can be applied to the present invention. In these figures, FIG. 5 is a front view of a light emitting device 100, FIG. 6 is a sectional perspective view along the line A-A in FIG. 5, FIG. 7 is a sectional perspective view along the line B-B in FIG. 5, FIG. 8 is a perspective view seen from an upper inclination of the side opposed to the front surface (hereinafter referred to as "back surface"), and FIG. 9 and FIG. 10 show a lead frame 102 used in a light emitting body according to the present embodiment.

The light emitting device 100 shown in these figures includes a package 101 that has a recessed portion on its front surface, a lead frame 102 exposed on the bottom surface of the recessed portion, and a light emitting element 103 that is mounted on the lead frame 102. The recessed portion is sealed by a sealing resin (not shown). As used herein, "recessed portion" denotes the "opening 2" as used in the first embodiment.

In the present embodiment, as shown in FIG. 6, the lead frame 102 includes a bent portion 102a that is bent towards the front surface side of the package 101 in the recessed portion of the package 101, and a projecting portion 102b that projects from the bottom surface of the package 101 to the outside with a 2-times curvature, and is disposed on the back surface of the package 101 as shown in FIG. 7. The light emitting element 103 is electrically connected with the lead frame 102 by a conductive member such as a wire 106, or the like.

In this manner, the lead frame 102 which mounts the light emitting element 103 can be configured as a light emitting device having high heat radiation performance by integrally forming the bent portion 102a that enables prevention of discoloration of an inner wall of the recessed portion formed in the package 101, and the projecting portion 102b which enables radiation of heat produced by the light emitting element 103 mounted on the lead frame. In this manner, a large surface area of the lead frame 102 can be formed in the recessed portion, and thereby enables configuration as a highly reliable light emitting device that suppresses deterioration of the sealing resin (not shown) and discoloration even when a large area of the sealing resin and the lead frame are in contact.

In the present embodiment, the projecting portion 102b as shown in FIG. 7 and FIG. 8 projects from the bottom surface of the package 101, and is bent along the bottom surface (the face forming the mounting face), and furthermore is bent along the back surface of the package 101. When the projecting portion 102b is bent in this manner, the surface area of the lead frame that is subjected to radiated heat can be increased even in a small light emitting device, for example even in a side-view light emitting device, without increasing the outer size of the light emitting device. The projecting portion 102b may be projected from an upper surface, and not from a bottom surface, and may bend along the upper surface, or may be disposed along the back surface. Both the upper surface and the bottom surface may be projected.

The respective members and the structure of the light emitting device 100 in the present embodiment will be described below.

Lead Frame 102

The lead frame 102 is embedded in an inner portion of the package 101, and is integrally molded using resin molding with the package 101 so that the upper surface of the lead frame 102, that is to say, the mounting face of the light emitting element 103 is exposed on the bottom surface of the recessed portion as described below.

The lead frame 102 may be substantially plate-shaped, or may be an undulating plate shape, or a plate shape that has an indented configuration. The thickness thereof may be uniform, or may exhibit localized thickness or thinness. There is no particular limitation on the material configuring the lead frame 102, and it is preferred that formation is executed using a material having a relatively large heat transfer coefficient. Formation using this type of material enables efficient release of heat produced by the light emitting element 103 to the projecting portion 102b as described below, and enables radiation to the outside.

For example, a preferred material has a heat transfer coefficient of at least 200 W/(m·K), has a relatively large mechanical strength, or can easily be processed by a punching pressing process, or etching process. More specifically, the material includes a metal such as copper, aluminum, gold, silver, tungsten, iron, nickel or the like, an iron-nickel alloy, a phosphor bronze alloy, or the like. Furthermore, it is preferred that reflective plating is provided for efficient extraction of light from the mounted light emitting element 103 on the surface of the lead frame 102.

In addition to the lead frame on which the light emitting element 103 is mounted, at least one lead frame is provided, and is electrically connected with the light emitting element 103 by a wire 106 or the like.

Bent Portion 102a

The lead frame 102 that mounts the light emitting element 103 has a bent portion 102a that is bent from a portion exposed at the bottom surface of the recessed portion of the package 101 towards the front surface of the package 101, that is to say, towards the light emitting face. The light that is radiated from the light emitting element 103 is shielded by the bent portion 102a and thereby enables prevention or suppression of discoloration of the inner wall of the recessed portion of the package 101. The application of reflective plating to the bent portion 102a enables an increase in the rate of extraction of light by efficient reflection of light from the light emitting element 103. A bent portion may be formed in the lead frame that mounts the light emitting element, and in addition, the lead frame may be bent along an inner wall of the recessed portion of the package in order to also suppress discoloration of the package 101 in the lead frame that does not mount a light emitting element. The bent portion 102a is the portion that acts as the reflection portion 9 in the first embodiment above.

FIG. 9 shows the lead frame 102 used in the present embodiment. FIG. 10 shows the curvature of the lead frame as shown in FIG. 9. Normally, the portion corresponding to the bent portion 102a of the plate-shaped lead frame as shown in FIG. 9 is bent, and after a package that includes a recessed portion is molded, the light emitting element 103 is mounted, the filling resin is filled into the recessed portion, and the projecting portion 102b that projects to the package outer portion, or the terminal portion 102c is bent along the package. However as shown in FIG. 10, the lead frame 102, the light emitting element 103, and the wire 106 are extracted from the completed light emitting device 100 as required.

As shown in FIG. 9, the bent portion 102a is connected with a light emitting element mounting portion 102d provided on the lead frame 102 that is manufactured by processing of a plate-shaped metallic plate. The bent portion 102a is formed at a position that covers the inner wall of the package from light emitted by the light emitting element in order to prevent discoloration of the package 101. The width and height of the bent portion 102a are suitably adjusted with reference to the size of the recessed portion of the package, or the like. For example, as shown in FIG. 9, the dimension α and the dimension β that denote the width of the bent portion 102a may have the same length, or a different length.

The bent portion 102a is preferably set to a large curvature when bent at a position opposed to the light emitting element 103 in order to prevent discoloration of the package 101. However, since the adhesion between the bent portion 102a, that is a portion of the lead frame, and the sealing resin that is filled into the recessed portion is lower than the adhesion between the package and the sealing resin, peeling tends to occur at the interface between the bent portion 102a and the sealing resin. Therefore, it is preferred that the width of the bent portion 102a that is exposed in the recessed portion is greater than or equal to the width of the light emitting element, the height of the bent portion that is exposed in the recessed portion is greater than or equal to the height of the light emitting element, and the package portion that is not covered by the bent portion 102a in the inner wall of the recessed portion is exposed. Exposure of the package portion along the entire circumference of the upper surface of the opening of the recessed portion is still further preferred. In this manner, discoloration of the package can be prevented, and at the same time, the adhesion between the sealing resin and the recessed portion can be maintained.

The folding angle of the bent portion 102a may be suitably adjusted. However in order to impart a function as a reflector, formation with an angle that widens towards the opening face of the recessed portion formed in the package is preferred. It is preferred that the terminal of the bent portion 102a is embedded into the package 101. In this manner, peeling between the bent portion 102a and the package 101 can be prevented. In the present embodiment, as shown in FIG. 5 and FIG. 6, the engaging portion 104 engages the end portion of the bent portion 102a with the inner wall of the recessed portion and is integrally formed with the package 101. When the lead frame is formed by insertion for example, the engaging portion 104 may be formed by provision of a trench corresponding to the die.

Projecting Portion 102b

The lead frame 102 mounting the light emitting element 103 includes a projecting portion 102b that projects and bends from the package 101 towards the outside, and is disposed on the back surface of the package 101. The projecting portion 102b denotes a section that projects from the package, and is exposed to the outside, and is configured as a section that is disposed along the bottom surface of the package, or along the upper surface. The heat radiation terminal 220 in first embodiment corresponds to the projecting portion 102b.

The projecting portion 102b preferably has a large surface area to improve heat radiation performance. The surface area of the projecting portion 102b is preferably 30% or more of the overall surface area of the lead frame 102 that mounts the light emitting element 103. In this manner, heat from the light emitting element 103 can be efficiently radiated.

When the size of the projecting portion 102b is increased, and a surface other than the back surface is used as the mounting face, the weight of the projecting portion 102b may be considered to have an adverse effect on balance when mounting the light emitting device. However in the present embodiment, as shown in FIG. 10, since the projecting portion 102b and the bent portion 102a are bent in mutually opposite directions, the center of gravity of the light emitting device can be prevented from exhibiting extreme deviation, and thereby enables a configuration of a light emitting device with excellent mounting characteristics.

In the present embodiment, as shown in FIG. 8, the notch portion 107 that enables accommodation of the projecting portion 102b disposed along the back surface of the package is provided on the back surface of the package 101. When the projecting portion 102b has a relatively large surface area and projects more to an outer side than the end portion of the package 101, there is a risk that the projecting portion 102b will bend as a result of an external force produced in the mounting process for the light emitting device. Deformation or bending of the projected portion 102b as a result of an external force can be prevented by forming a notch, and accommodating the projecting portion 102b in the notch portion 107.

The position at which the projecting portion 102b projects from the package preferably exhibits right-left symmetry. Adhesion between the package 101 and the lead frame 102 can be improved by provision of a groove portion 102f on the position of projection from the package, and is therefore preferred. As shown in FIG. 9, the projecting portion 102b is preferably provided to extend from both sides of the light emitting element mounting portion 102d in a right-left symmetrical configuration. This configuration enables efficient radiation of heat to the outside by dispersing the heat produced by the light emitting element in a right-left symmetrical configuration.

It is preferred that the section of the projecting portion 102b that projects from the package is provided at a position in closest proximity to the light emitting element mounting portion. Thereby, heat produced by the light emitting element 103 can be radiated more rapidly to the outside.

As shown in FIG. 10, in the present embodiment, the projecting portion 102b is electrically connected with the light emitting element 103. In other words, the lead frame 102 has a bent portion 102a and a projecting portion 102b, and further includes a terminal portion 102c for connection with an external power source. The terminal portion 102c branches from the lead frame 102, and projects from the bottom surface of the package. Since the projecting portion 102b is electrically connected with the light emitting element 103, the projecting portion 102b can also be used for connection with the external power source. However, independently of the projecting portion 102b, a side fillet can be formed when using solder to mount the light emitting device by forming a pair of connection terminal portions 102c along the right and left side surfaces of the package 101. Thereby, a configuration of a light emitting device is enabled that has excellent mounting performance and heat radiation performance. Furthermore, since the surface area of the lead frame 102 mounting the light emitting element is increased by inclusion of the surface area of the terminal portion 102c, configuration of a light emitting device with excellent heat radiation performance is enabled.

Figure 11:
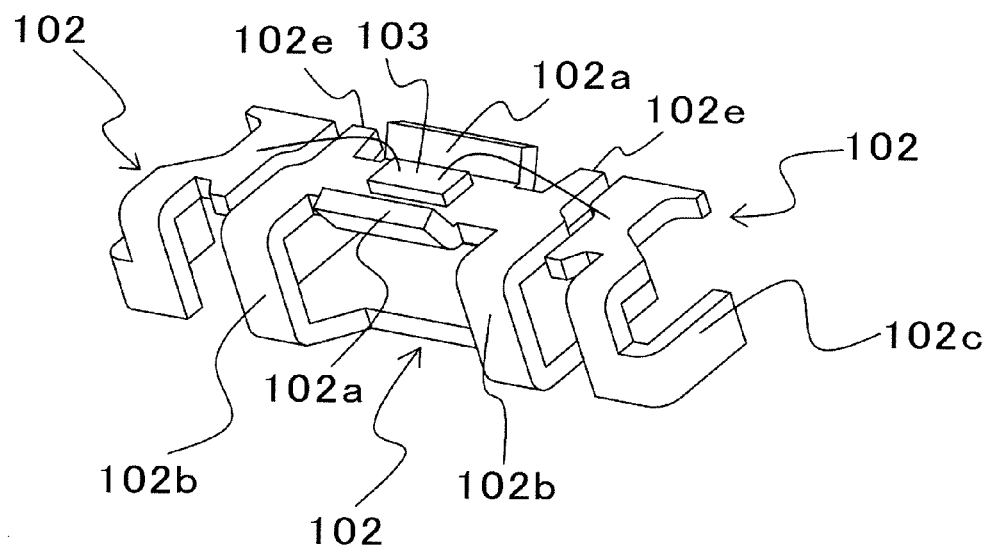
FIG. 11 shows a lead frame used in the light emitting body according to the present invention.

Conversely, as shown in FIG. 11, the lead frame 102 that includes the projecting portion 102b can be connected with a wire to the adjacent lead frame, and not used for electrical connection with the light emitting element 103. In this configuration, adjacent lead frames do not have independent polarity, and therefore shorting can be prevented even when a current passes through adjacent lead frames due to a reason such as migration or the like.

The lead frame 102 as shown in FIG. 9 to FIG. 11 is preferably provided with at least a pair of supporting portions 102e at a position sandwiching the bent portion 102a, or at a position exhibiting substantial symmetry by sandwiching the section projecting from the package and the light emitting element mounting portion. The supporting portions 102e are embedded in the package 101. In this manner, peeling of the lead frame 102 from the package 101 can be prevented as a result of stress produced when the projecting portion 102b is bent by an outer portion of the package 101.

Light Emitting Element 103

A semiconductor light emitting element such as a LED can be suitably used as the light emitting element 103. Such elements are suitably employed in a component that uses a semiconductor such as an ZnS, SiC, GaN, GaP, InN, MN, ZnSe, GaAsP, GaAlAs, InGaN, GaAlN, AlInGaP, AlInGaN, or the like as a light emitting layer on a substrate by application of liquid phase deposition, a HDVPE method, or a MOCVD method. Selection of the material of the semiconductor layer or the degree of crystallization thereof enables selection of various emission wavelengths from ultraviolet light to infrared light in the light emitting element 103. For example, $In_xAl_yGa_{1-x-y}N$ ($0 \leq X \leq 1, 0 \leq Y \leq 1, X+Y \leq 1$) can be used as the material in the light emitting layer. A light emitting element can be configured from a combination of this type of light emitting element and various types of phosphors that are excited by emitted light to emit light having a wavelength that is different from the emitted light wavelength of the light emitting element. The material used in the light emitting element that emits a red light is preferably selected from a gallium-aluminum-arsenic semiconductor, or an aluminum-indium-gallium-phosphorous semiconductor. It is preferred that a color display device is configured from a combination of LED chips with a red emission wavelength of 610 nm to 700 nm, a green color of 495 nm to 565 nm, and a blue emission wavelength of 430 to 490 nm.

The light emitting element 103 is electrically connected with the terminal portion 102c that supplies electrical power to the light emitting element 103.

The number of light emitting elements 103 that are mounted on the lead frame 102 may be one, or a plurality thereof. A plurality of light emitting elements that emit the same color of light may be combined in order to improve the luminous intensity. For example, color reproduction may be improved by combining a plurality of light emitting elements of different emission colors adapted to an RGB system for example. It is preferred that when mounting a plurality of light emitting elements 103, all the light emitting elements are mounted to face the bent portion 102a.

As required, a wavelength conversion member may be disposed on the periphery of the light emitting element 103 to convert the wavelength of light from the light emitting element to convert and output as light of a different wavelength. The wavelength conversion member may be formed by mixing phosphors into the translucent resin that are excited by light from the light emitting element and emit florescent light. In this manner, light from the light emitting element is converted to light having a longer wavelength, and mixed-color light including the light from the light emitting element and the long-wavelength light converted by the wavelength conversion member is extracted to the outside.

Mounting of Semiconductor Element

The light emitting element 103 is fixed to the surface of the lead frame 102 by die bonding with a bonding member. When using a light emitting element 103 that exhibits blue and green light emission, and is formed by depositing a nitrous semiconductor on an insulating layer (sapphire substrate), this type of bonding member for example may be an epoxy resin, a silicone resin, or the like. When the deterioration of the bonding member caused by heat or light from the light emitting element 103 is taken into account, an Al plating may formed on the back surface of the light emitting element, and solder such as an Au—Sn eutectic crystal, a brazing filler material such as a low-melting point metal, or the like, or a conductive paste, or the like may be used as a bonding material. Furthermore die bonding may be performed using a conductive paste of silver, gold, palladium, or the like when the light emitting element is formed from GaAs or the like, and forms an electrode on both faces such as a light emitting element that emits red light.

Flip Chip Bonding or Wire Bonding

The electrical connection between the light emitting element 103 and the lead frame 102 is created by a flip chip mounting that uses a conductive member (facedown mounting) or a face-up mounting that uses a conductive wire.

The conductive material used in the flip chip mounting includes a metal bump such as Au, a solder such as an Au—Sn eutectic crystal, an anisotropic conductive material, or a conductive paste such as Ag, or the like. It is preferred that the conductive wire has superior ohmic characteristics, or superior mechanical connection characteristics, or superior electrical conductivity and heat transfer characteristics. Heat conductivity is preferably at least 0.01 cal/(S·cm$^{2.\circ}$ C./cm, and more preferably 0.5 cal/S·cm$^{2.\circ}$ C./cm. In consideration of operational characteristics, the diameter of the conductive wire is preferably about 10 μm to 45 μm. The material used in this type of wire may be for example a metal such as gold, copper, platinum, aluminum, or the like, or an alloy thereof.

Sealing Resin (not Shown)

The recessed portion is filled with a sealing resin in a configuration in which the light emitting element 103 is mounted on the lead frame 102 in the recessed portion. In this manner, the light emitting element 103 can be protected from an external force or moisture or the like, and the conductive member such as a wire 106 or the like can be protected. The sealing resin has translucent characteristics in order to extract light from the light emitting element. A sealing resin that can be used as this type of sealing resin includes a translucent resin that has excelling weather resistance such as an epoxy resin, a silicone resin, an acrylate resin, a urea resin, or the like. In particular, even when moisture is contained in the translucent covering material during processing or storage, the translucent resin enables release of moisture contained in the resin to the outside by baking for 14 hours or more at 100° C. This configuration is preferred since fracture due to water vapor, or peeling between the light emitting element and the molding member.

A suitable filler or a scattering agent, a dispersion agent or the like may be suitably dispersed in the sealing resin.

A wavelength conversion layer that includes a mixture of a wavelength conversion member such as a phosphor may be provided. The dispersion agent disperses light, to thereby mitigate the directivity from the light emitting element, and thereby increase the angular field of view. The phosphor material converts light from the light emitting element, and enables conversion of the wavelength of light emitted from the light emitting element to the outside of the package. When the light from the light emitting element is visible light with a short high-energy wavelength, various types of phosphors such as a perylene semiconductor that is an organic phosphor, or an inorganic phosphor such as nitrous $CaO—Al_2O_3—SiO_2$ or the like that is activated by ZnCdS:Cu, YAG:Ce, Eu and/or Cr. When white light is obtained by the light emitting device, and in particular when a YAG:Ce phosphor is used, the phosphor content enables a comparatively simple and highly reliable configuration of a white-light system in which light from a blue-light emitting element can be emitted together with a yellow-light system that absorbs a part of the blue light as a complementary color. In the same manner, when a nitrogen-containing $CaO—Al_2O_3PSiO_2$ phosphor that is activated by Eu and/or Cr is used, the phosphor content enables a comparatively simple and highly reliable configuration of a white-light system in which light from a blue-light emitting element can be emitted together with a red-light system that absorbs a part of the blue light as a complementary color. Furthermore color unevenness can be reduced by completely submerging the phosphor to thereby remove air bubbles.

Package 101

The package 101 includes a recessed portion on a front surface thereof, and is formed by a method such as injection molding to enable exposure of the lead frame as described above on the bottom surface of the recessed portion.

A thermoplastic resin such as a liquid crystal polymer, a polyphthalamide resin, polybutylene terephthalate (PBT), or the like may be used the forming material for the package 101. In particular, use of a semicrystalline polymer that includes a high-melting point crystal such as a polyphthalamide resin is preferred due to high surface energy and superior adhesion with the sealing resin that is filled into the recessed portion of the package 101. In this manner, generation of peeling at the interface between the package and the sealing member during a resin cooling process can be suppressed during the step of filling and curing the sealing member. Furthermore, a white pigment such as tungsten oxide may be mixed into the molding member.

A protruding portion 105 may be formed between the projecting portion 102 and the terminal portion 102c on the bottom surface of the package as shown in FIG. 5. This protruding portion enables prevention of a risk of short circuiting during mounting between adjacent lead frames having different polarity.

Third Embodiment

Figure 12:
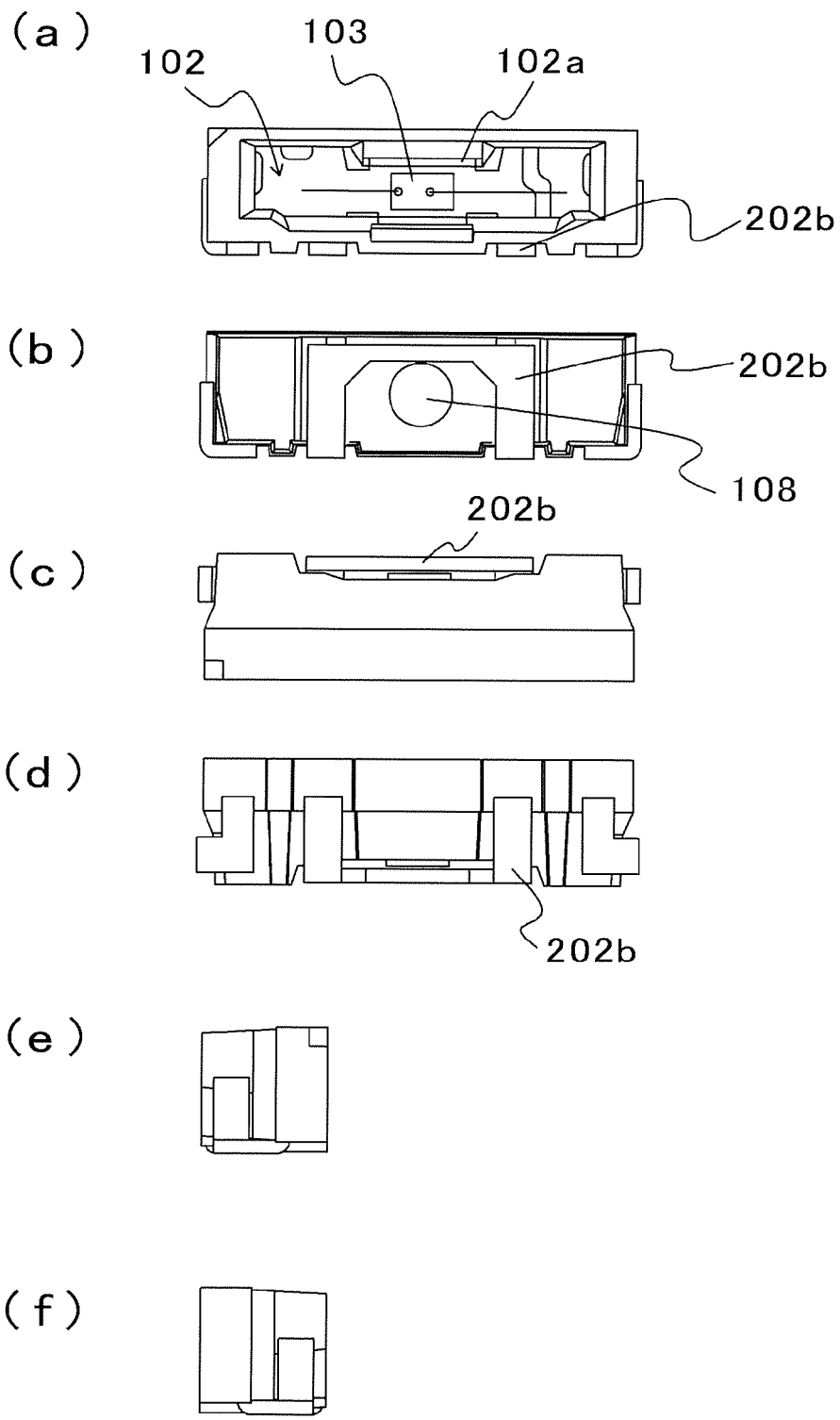
FIGS. 12(a) to 12(f) show six views of the light emitting body according to a third embodiment of the present invention.

The shape of the light emitting device is not limited to the above configuration, and various shapes may be used. An example is shown in FIG. 12 of a light emitting device that varies the shape of the projecting portion. FIG. 12(a) is a front view, (b) is a rear view, (c) is a plan view, (d) is a bottom view, (e) is a left view, and (f) is a right view. As shown in FIG. 12(b), the projecting portion 202b that is disposed on the back surface side of the package is formed to avoid contact with the resin injection port (gate) 108 that is used during injection molding of the package. The same effect as the second embodiment is obtained by this configuration.

Fourth Embodiment

Figure 13:
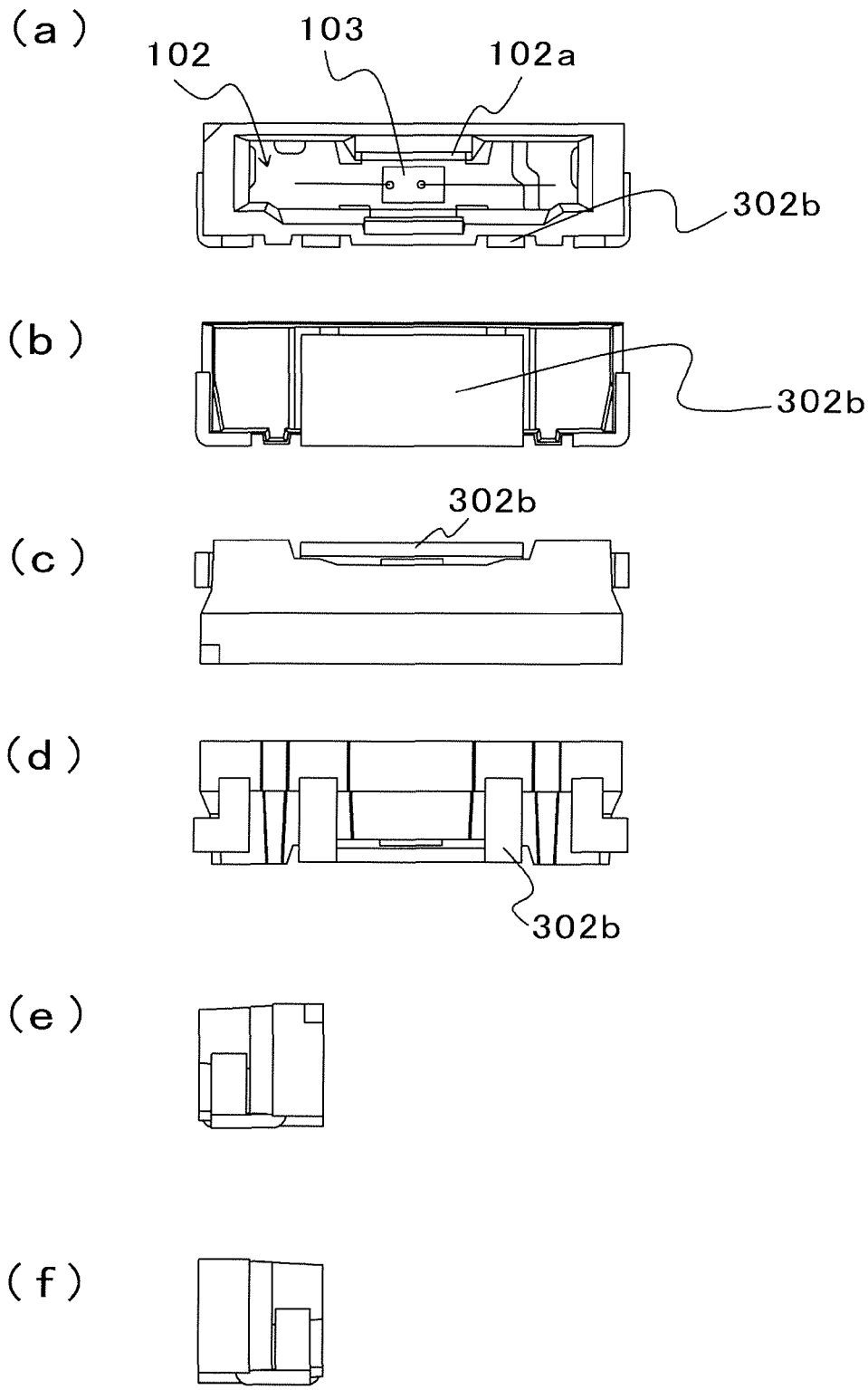
FIGS. 13(a) to 13(f) show six views of the light emitting body according to a fourth embodiment of the present invention.

In yet another aspect, in the same manner as the third embodiment, an example of a light emitting device that varies the shape of the projecting portion is shown in FIG. 13. FIG. 13(a) is a front view, (b) is a rear view, (c) is a plan view, (d) is a bottom view, (e) is a left view, and (f) is a right view. The surface area of a projecting portion 302b disposed on the back surface side of the package is increased as much as possible. The same effect as the second embodiment is obtained by this configuration.

First Working Example

The working examples of the present invention will be described in detail below. The present invention is not of course limited to the following working examples.

The light emitting device 1 according to the working example as shown in FIG. 1C is a light emitting device that includes a package 4 that has an opening 2, and a lead frame 6 on the bottom surface of the opening 2. In this working example, the lead frame 6 has a reflection portion 8 in which a portion of the lead frame is bent on the side surface of the opening, and a portion of the inner wall surface 10 in the reflection portion 8 is positioned on an inner portion of the package 4. Towards an upper surface of the opening from the portion covering a section of the inner wall surface 10 of the reflective portion 8, the side surface of the opening has an inclination face 16 with an inclination angle $\theta_1$ relative to the bottom surface of the opening that is smaller than the inclination angle $\theta_2$ of the reflection portion 8 relative to the bottom surface of the opening 2.

In the present working example, firstly, a lead-frame plate is processed with silver plating on the surface of a metal plate formed from a copper-iron alloy that has a thickness of 0.11 mm. Then, a section that forms the reflection portion is bent through 60 degrees relative to the surface of the lead-frame plate. The lead-frame plate formed in this manner is disposed in the die, and a molding material such as a polyphthalamide resin is injected, cured, and the die is removed. The light emitting element 12 formed from a nitrous semiconductor is attached and fixed by an epoxy resin to the lead frame of the resulting package. Then the electrode of the fixed light emitting element and the lead frame are connected by a conducting wire that includes a principal component of Au.

Then a modified silicon resin including a mixture of an epoxy resin and a silicone resin with a YAG phosphor at a predetermined proportion (5 to 30 wt %) is filled into the opening 2, and cured into a hot blast oven (curing conditions: 150° C., 4 hours) to thereby form the sealing member 14.

In this working example, the width W1 of the reflection portion is 0.85 mm, the height H1 of the reflection portion is 0.23 mm, and the thickness of the reflection portion is 0.11 mm.

The width W2 of the light emitting element is 0.5 mm, and the height H3 is 0.12 mm.

The height H2 of the package is 1 mm.

The resulting light emitting device 1 includes an opening 2, and includes a lead frame 6 on the bottom surface of the opening. The lead frame 6 has a bent reflection portion 8 on the side surface of the opening, and a portion of the inner wall surface 10 of the reflection portion 8 is positioned on an inner portion of the package 4. On the inner wall surface 10 of the reflection portion 8, 10% of the overall inner wall surface from the upper end of the inner wall surface is covered by the package.

In this manner, the light from the light emitting element is reflected by the high-reflectance reflection portion 8, and thereby prevents discoloration of the package 4. The adhesion between the reflection portion 8 and the package 4 can be further strengthened since the inner wall surface 10 of the reflection portion 8 is in the inner portion of the package 4, and thereby enables prevention of peeling at the interface of the reflection portion 8 and the package 4.

In this working example, towards an upper surface of the opening from the portion covering a section of the inner wall surface, the side surface of the opening has an inclination face 16 with an inclination angle $\theta_1$ relative to the bottom surface of the opening that is smaller than the inclination angle $\theta_2$ of the reflection portion relative to the bottom surface of the opening. The inclination angle $\theta_1$ of the inclination face relative to the bottom surface of the opening is 30 degrees, and the inclination angle $\theta_2$ of the reflection portion relative to the bottom surface of the opening is 60 degrees.

This configuration enables a configuration in which light from the light emitting element does not become direct incident upon the upper surface of the opening, and thereby more effective prevention of package discoloration is enabled.

In the present working example, a sealing member 14 containing a phosphor is formed in the opening 2, and the phosphor is preferably contained at least more towards the bottom surface side of the opening than the portion covering a section of the inner wall surface. In this manner, heat produced by the phosphors can be transmitted to the reflection portion 8, and thereby enables radiation of heat through the lead frame and to the outside.

Second Working Example

FIG. 2A is a front view showing another light emitting device according to the present invention, 2B is a rear view of FIG. 2A, 2C is a plan view of FIG. 2A, 2E is a left view of FIGS. 2A, and 2F is a right view of FIG. 2A. FIG. 2G is a perspective view seen from an upper inclination of FIG. 1A. FIG. 2H is a perspective view seen from a rear inclination of FIG. 2A. FIG. 2I is a sectional view along A-A in FIG. 2A. FIG. 2J is a front diagonal view showing the sealing member in FIG. 2A. FIG. 2K is a front view showing the state when the sealing member is not filled.

The light emitting device 201 according to the second working example forms a heat radiating terminal 220. When the light emitting device 201 is mounted, the heat radiating terminal 220 is formed on a face on the mounting side. High thermal radiation performance is enabled by forming the heat radiating terminal on the face on the mounting side. In this manner, efficient radiation of heat produced by the light emitting element is enabled, and thereby discoloration can be prevented. Furthermore, the degree to which the heat radiating terminal 220 is mounted on the mounting face brings the center of gravity towards the mounting face, and thereby improves mounting characteristics.

Other aspects have a configuration that is substantially the same as the light emitting device according to the first working example.

Third Working Example

A light emitting device according to a third working example will be described below. Description of those aspects that are the same as the light emitting device according to the second embodiment will be omitted.

FIG. 5 is a front view of a light emitting device 100 according to a third working example, and has dimensions of substantially a thickness 1.0 mm×width 3.4 mm×depth 1.0 mm. The depth of the recessed portion formed in the package is 0.3 mm.

Firstly, a lead frame 102 is prepared in which a bent portion 102a and a projecting portion 102b are integrated as a light emitting element mounting portion 102d as shown in FIG. 9. The dimension $\alpha$ of the bent portion 102a is 0.85 mm, the dimension $\beta$ is 0.7 mm, and the dimension $\gamma$ is 0.2 mm. The lead frame 102 is formed from a plate-shaped body formed from a copper-iron alloy. The surface of the lead frame 102 is plated with silver in order to reflect light from the light emitting element. The bent portion 102b of the lead frame is bent so that the angle formed by the light emitting element mounting portion 102d and the reflection face of the bent portion is approximately 60 degrees as shown by the dotted line. A package 101 provided with a recessed portion on a front surface thereof is injection molded using the lead frame formed in the above manner and a polyphthalamide resin. When viewed from the front, three protruding portions are formed on the bottom portion of the package 101. The projecting portion 102b and the terminal portion 102c, and not the protruding portion, are accommodated in the portion forming the recess.

Next, a light emitting element 103 having a width of 0.5 mm and a height of 0.12 mm is mounted and fixed by a bonding member of epoxy resin on the light emitting element mounting portion of the lead frame that is exposed on the bottom surface in the recessed portion of the package. The light emitting element 103 uses a light emitting element that includes a gallium nitride semiconductor that emits blue light that has an emission peak wavelength of approximately 470 nm. On a sapphire substrate, the light emitting element 103 has laminated layers including a buffer layer formed from a gallium nitride, a n-type contact and cladding layer formed from GaN, a p-type cladding layer formed from GaAlN, and a p-type contact layer formed from GaN. An InGaN layer that forms a multi-quantum well is formed between the n-type contact layer and the p-type contact layer. A negative electrode is formed from the semiconductor layer on the sapphire substrate by etching a portion of the nitrous semiconductor to thereby expose the n-type contact layer and form the negative electrode. The translucent conductive layer functions as an ohmic electrode on the p-contact layer, and a positive electrode is formed thereupon. The light emitting element 103 is electrically connected with the lead frame 102 through the wire 106.

A silicon resin is used as the sealing resin for filling the recessed portion. The silicon resin includes a $(Y,Gd)_3Al_5O_{12}$:Ce (YAG) phosphor having a particle diameter of 10 μm to 20 μm as a wavelength conversion member. In this manner, a light emitting device that emits a white light can be configured.

Finally, the lead frame 102 (the projecting portion 102b and the terminal portion 102c) that projects from the package towards the outside is bent along the package to configure the light emitting device according to the present working example. A light emitting device that is formed in the above manner has the conspicuous effect of reducing discoloration of the package, and reducing the deterioration of the sealing resin.

The semiconductor device according to the present invention may be used as a light source for a liquid-crystal back light, light sources for various types of indicators, a panel meter, an indicating light or surface light switch, and an optical sensor, or the like.

The invention claimed is:

1. A light emitting device comprising:
a package that has an opening provided with a side surface and a bottom surface; and
a lead frame that is exposed to the bottom surface,
the lead frame including a reflection portion bent on the side surface, and a portion of an inner wall surface of the reflection portion being covered by the package.

2. The light emitting device according to claim 1, wherein the inner wall surface includes a notch or a groove, and the notch or the groove is covered by the package.

3. The light emitting device according to claim 1, wherein towards an upper surface of the opening from the portion covering a section of the inner wall surface, the side surface of the opening includes a face that has an angle of inclination relative to the bottom surface that is smaller than the angle of inclination relative to the bottom surface of the reflection portion.

4. The light emitting device according to claim 1 further comprising
a sealing member provided in the opening and including phosphors, the phosphors being disposed more on the bottom surface side than on a portion at least covering a section of the inner wall surface.

5. The light emitting device according to claim 1, wherein the lead frame has a projecting portion that is bent to project from the package to an outer portion, and is disposed on a face opposed to a front surface of the package.

6. A light emitting device comprising:
a package that has a front surface and a back surface opposite the front surface, the front surface including a recessed portion;
a lead frame having a light emitting element mounting portion that is exposed to a bottom surface of the recessed portion;
a light emitting element that is disposed on the lead frame; and
a sealing resin that is filled into the recessed portion,
the lead frame including
a bent portion that is bent towards the front surface of the package within the recessed portion, and
a projecting portion that is bent to project from the package towards an outer portion, and is further bent to extend along the back surface of the package.

7. The light emitting device according to claim 6 wherein a notched portion is provided on the back surface of the recessed portion opposed to the front surface of the package, and the projecting portion is accommodated within the notched portion.

8. The light emitting device according to claim 6, wherein the lead frame includes at least a pair of supporting portions that sandwich the bent portion and are embedded into the package.

9. The light emitting device according to claim 6, wherein a portion of the inner wall surface of the bent portion is covered by the package.

10. The light emitting device according to claim 2, wherein towards an upper surface of the opening from the portion covering a section of the inner wall surface, the side surface of the opening includes a face that has an angle of inclination relative to the bottom surface that is smaller than the angle of inclination relative to the bottom surface of the reflection portion.

11. The light emitting device according to claim 7, wherein the lead frame includes at least a pair of supporting portions that sandwich the bent portion and are embedded into the package.

12. A light emitting device comprising:
a package that has an opening provided with a side surface and a bottom surface; and
a lead frame that is exposed to the bottom surface;
the lead frame including a reflection portion bent on the side surface, and
the side surface of the opening including a face that has an angle of inclination relative to the bottom surface that is smaller than the angle of inclination relative to the bottom surface of the reflection portion.

13. The light emitting device according to claim 12, wherein the lead frame is provided with an inner wall surface, the inner wall surface includes a notch or a groove, and the notch or the groove is covered by the package.

14. The light emitting device according to claim 12, further comprising
a sealing member provided in the opening and including phosphors, the phosphors being disposed more on the bottom surface side.

15. The light emitting device according to claim 14, wherein the lead frame has a projecting portion that is bent to project from the package to an outer portion, and is disposed on a face opposed to a front surface of the package.

16. The light emitting device according to claim 12, wherein a notched portion is provided on the face opposed to the front surface of the package, and the projecting portion is accommodated in the notched portion.

17. The light emitting device according to claim 12, wherein the lead frame includes a bent portion that is bent towards the front surface of the package in the recessed portion, and includes at least a pair of supporting portions that sandwich the bent portion and are embedded into the package.

18. The light emitting device according to claim 17, wherein a portion of the inner wall surface of the bent portion is covered by the package.

19. The light emitting device according to claim 6 wherein the projecting portion is provided to extend from both sides of the light emitting element mounting portion.

20. The light emitting device according to claim 6 wherein the lead frame further includes a pair of connection terminal portions for connection with an external power source, and the pair of connection terminal portions extending along opposite side surfaces of the package.

* * * * *

UNITED STATES PATENT AND TRADEMARK OFFICE
CERTIFICATE OF CORRECTION

| | | |
|---|---|---|
| PATENT NO. | : 8,525,208 B2 | Page 1 of 1 |
| APPLICATION NO. | : 13/056580 | |
| DATED | : September 3, 2013 | |
| INVENTOR(S) | : Morito Kanada et al. | |

It is certified that error appears in the above-identified patent and that said Letters Patent is hereby corrected as shown below:

Title Page, please change the listing of [75] from

[75] Inventors: Morito Kanada, Anan (JP); Hideo Asakawa, Anan (JP)

to

-- [75] Inventors: Morito Kanada, Tokushima (JP); Hideo Asakawa, Anan (JP) --

Signed and Sealed this
Fifth Day of November, 2013

Teresa Stanek Rea
*Deputy Director of the United States Patent and Trademark Office*